(12) United States Patent
Cyrusian

(10) Patent No.: US 7,551,028 B1
(45) Date of Patent: Jun. 23, 2009

(54) SIGNAL GENERATORS FOR CURRENT-MODE THREE-LEVEL DIGITAL AMPLIFIERS

(75) Inventor: Sasan Cyrusian, Scotts Valley, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/001,357

(22) Filed: Dec. 11, 2007

Related U.S. Application Data

(60) Provisional application No. 60/869,502, filed on Dec. 11, 2006.

(51) Int. Cl.
H03F 3/217 (2006.01)
(52) U.S. Cl. .................. 330/251; 330/10; 330/207 A
(58) Field of Classification Search ............ 330/10, 330/251, 207 A; 375/238
See application file for complete search history.

(56) References Cited

U.S. PATENT DOCUMENTS

| | | | |
|---|---|---|---|
| 6,791,405 B2 * | 9/2004 | Tsuji et al. | 330/10 |
| 7,230,485 B2 * | 6/2007 | De Cremoux et al. | 330/251 |
| 7,312,657 B2 * | 12/2007 | Kurokawa | 330/251 |
| 7,453,316 B2 * | 11/2008 | Shimizu | 330/10 |

\* cited by examiner

*Primary Examiner*—Robert Pascal
*Assistant Examiner*—Hieu P Nguyen

(57) ABSTRACT

Apparatus having corresponding methods comprise: a first fixed current source to produce a first fixed current; a second fixed current source to produce a second fixed current; a first adjustable current source to produce a first adjustable current; a first switch to deliver the first fixed current and the first adjustable current to a first output node when the first switch is closed; a second switch to deliver the second fixed current to the first output node when the second switch is closed; and an adjustment circuit to adjust the first adjustable current according to the first fixed current, the second fixed current, and the adjustable current.

60 Claims, 21 Drawing Sheets

SIGNAL GENERATORS FOR CURRENT-MODE THREE-LEVEL DIGITAL AMPLIFIERS

CROSS-REFERENCE TO RELATED APPLICATIONS

This application claims the benefit of U.S. Provisional Patent Application Ser. No. 60/869,502 filed Dec. 11, 2006, the disclosure thereof incorporated by reference herein in its entirety.

BACKGROUND

The present disclosure relates generally to amplifiers. More particularly, the present disclosure relates to signal generators for current-mode three-level digital amplifiers.

Audio amplifiers are well known and are used extensively to amplify audio signals. Designing an audio amplifier generally requires balancing two competing concerns. The first concern is fidelity which relates to the accuracy with which the audio amplifier reproduces the sounds contained in the audio signal. The second concern is power efficiency, which relates to the power consumption of the audio amplifier under various operating conditions.

FIG. 1 is a block diagram of an audio amplifier 10, as known in the prior art. Digital-to-analog converter (DAC) 12 converts the digital audio signal $D_{dig}$ to an analog audio signal. The converted audio signal is applied to a class AB amplifier 14. The amplified audio signal is applied to speaker 16 via AC coupling capacitor 18. As is well known, amplifier 14 has a relatively low efficiency, thus rendering this amplifier undesirable for handheld portable devices which often have a limited battery life and/or internal cooling capacity.

FIG. 2 is a functional block diagram of a conventional analog class D audio amplifier 20. Class D audio amplifier 20 is generally more efficient than class AB amplifier 14 shown in FIG. 1. The fidelity of class D audio amplifier 20 can be comparable to that of Class AB audio amplifier 14 depending on variables such as switching frequency, thermal noise of resistors 24 and 50, noise of amplifier 28, noise and distortion of signal generator 36, noise of comparator 34, the loop delay and the blanking time of driver 40.

DAC 12 converts the digital audio signal $D_{dig}$ to an analog audio signal which is subsequently amplified by operational amplifier (opamp) 22. Opamp 22 supplies the amplified audio signal to integrator 26 via resistive load 24. Integrator 26 includes an opamp 28 and a feedback capacitor 30. The output signal of integrator 26 is supplied to one of the input terminals of comparator 34. The other input terminal of comparator 34 receives a sawtooth or triangular waveform generated by sawtooth/triangular waveform generator 36. Comparator 34 and sawtooth/triangular waveform generator 36 together form a natural frequency sampling module 32 that generates a pulse-width modulated (PWM) signal. The frequency of the sawtooth/triangular waveform is usually at least 10 times higher than the maximum audible frequency included in the analog audio signal.

Logic and pre-driver 38 converts the received PWM signal into signals suitable for use by driver 40. In some embodiments, driver 40 is single-ended and includes a switch, such as a transistor and the like, that switches power to low-pass filter 44. Such a switch is opened and closed based on the signals received from logic and pre-driver 38. The output signal of driver 40 is applied to low pass filter 44 and is also fed back to integrator 26 via resistor 50. Low-pass filter 44 removes the switching harmonics form the signal it receives via driver 40. Low-pass filter 44 is shown as including an inductor 46 and a capacitor 48. Signal OUT generated by driver 40 is delivered to speaker 16.

FIG. 3 is a block diagram of driver 40 coupled to low-pass filter 44 and speaker 16. Switches 52 and 54 are controlled by signals POS and NEG received from logic and pre-driver 38. To apply a positive pulse to speaker 16, switch 52 is turned on and switch is turned off. To apply a negative pulse to speaker 16, switch 54 is turned on and switch 52 is turned off. Inductor 46 together with capacitor 48 form a low-pass filter that attenuate the high frequency signal components. An AC coupling capacitor 82 can be connected in series with speaker 16 to eliminate a direct current (DC) component of the signal applied to speaker 16.

FIG. 4 is a timing diagram of the input signals received and output signal generated by comparator 34. Sinusoidal signal 62 represents the input signal received from integrator 26. Sawtooth signal 64 represents the signal generated by waveform generator 36. Signal 66 represents the output signal of comparator 34 and is a pulse-width modulated (PWM) signal. The duty cycle of PWM signal 66 is determined by the amount of time that the magnitude of signal 62 is greater than the magnitude of signal 64. The period of PWM signal 66 is determined by the period of signal 64.

SUMMARY

In general, in one aspect, an embodiment features an apparatus comprising: a first fixed current source to produce a first fixed current; a second fixed current source to produce a second fixed current; a first adjustable current source to produce a first adjustable current; a first switch to deliver the first fixed current and the first adjustable current to a first output node when the first switch is closed; a second switch to deliver the second fixed current to the first output node when the second switch is closed; and an adjustment circuit to adjust the first adjustable current according to the first fixed current, the second fixed current, and the adjustable current.

Embodiments of the apparatus can include one or more of the following features. Some embodiments comprise a third switch to deliver the first fixed current and the first adjustable current to a calibration node when the third switch is closed; and a fourth switch to deliver the second fixed current to the calibration node when the fourth switch is closed; wherein the adjustment circuit adjusts the first adjustable current according to a voltage occurring at the calibration node when the third and fourth switches are closed. In some embodiments, the adjustment circuit comprises: a comparator to produce a calibration voltage at a comparator output, the calibration voltage based on a reference voltage and a voltage occurring at the calibration node when the third and fourth switches are closed; and a fifth switch to couple the comparator output and a control input of the first adjustable current source when the fifth switch is closed, wherein the first adjustable current source adjusts the first adjustable current in accordance with the control input. In some embodiments, when the apparatus is in an amplification mode, the first and second switches operate according to respective first and second input signals, and the third, fourth, and fifth switches is are open; and when the apparatus is in a calibration mode, the third, fourth, and fifth switches are closed, and the first and second switches are open. Some embodiments comprise a sixth switch to deliver the first fixed current and the first adjustable current to a dummy node when the sixth switch is closed; and a seventh switch to deliver the second fixed current to the dummy node when the seventh switch is closed; wherein when the apparatus is in the amplification mode, the sixth switch is open when the first switch is closed and closed when the first switch is open, and the seventh switch is open when the second switch is closed and closed when the second switch is open. In some embodiments, at least one of the current sources comprises at least one of: a resistive degenerated current source; and a cascode transistor. In some embodiments, at least one of the switches comprises at least one of: a T-switch; and a T-switch, wherein each gate of the T-switch is driven by independent inverter chains. In some embodiments, the adjustment circuit comprises: a chopper-stabilized differential amplifier. Some embodiments comprise a first bridge comprising the first fixed current source, the second fixed current source, the first adjustable current source, the first switch, and the second switch; and a second bridge comprising a third current source to produce a third current, a fourth current source to produce a fourth current, a second adjustable current source to produce a second adjustable current, a third switch to deliver the third current and the second adjustable current to the first output node when the third switch is closed, and a fourth switch to deliver the fourth current to the first output node when the fourth switch is closed; wherein the first bridge is in an amplification mode when the second bridge is in a calibration mode, and the second bridge is in the amplification mode when the first bridge is in the calibration mode; wherein the adjustment circuit adjusts the first adjustable current when the first bridge is in the calibration mode; and wherein the adjustment circuit adjusts the second adjustable current according to the third current, the fourth current, and the second adjustable current when the second bridge is in the calibration mode. Some embodiments comprise a fifth switch to deliver the first fixed current and the first adjustable current to a calibration node when the fifth switch is closed; and a sixth switch to deliver the second fixed current to the calibration node when the sixth switch is closed; a seventh switch to deliver the third current and the second adjustable current to the calibration node when the seventh switch is closed; and an eighth switch to deliver the fourth current to the calibration node when the eighth switch is closed; wherein the fifth and sixth switches are closed and the seventh and eighth switches are open when the first bridge is in the calibration mode and the second bridge is in the amplification mode; and wherein the fifth and sixth switches are open and the seventh and eighth switches are closed when the first bridge is in the amplification mode and the second bridge is in the calibration mode. In some embodiments, the adjustment circuit comprises: a comparator to produce a calibration voltage at a comparator output, the calibration voltage based on a reference voltage and a voltage occurring at the calibration node; a ninth switch to couple the comparator output and a control input of the first adjustable current source when the ninth switch is closed, wherein the first adjustable current source adjusts the first adjustable current in accordance with the control input of the first adjustable current source; and a tenth switch to couple the comparator output and a control input of the second adjustable current source when the tenth switch is closed, wherein the second adjustable current source adjusts the second adjustable current in accordance with the control input of the second adjustable current source. Some embodiments comprise an eleventh switch to deliver the first fixed current and the first adjustable current to a first dummy node when the eleventh switch is closed; a twelfth switch to deliver the second fixed current to the first dummy node when the twelfth switch is closed; a thirteenth switch to deliver the third current and the second adjustable current to a second dummy node when the thirteenth switch is closed; a fourteenth switch to deliver the fourth current to the second dummy node when the fourteenth switch is closed; wherein when the first bridge is in the amplification mode, the eleventh switch is open when the first switch is closed and closed when the first switch is open, and the twelfth switch is open when the second switch is closed and closed when the second switch is open; wherein when the second bridge is in the amplification mode, the thirteenth switch is open when the third switch is closed and closed when the third switch is open, and the fourteenth switch is open when the fourth switch is closed and closed when the fourth switch is open; wherein when the first bridge is in the calibration mode, the first, second, eleventh, and fourteenth switches are open, and the fifth, sixth and ninth switches are closed; and wherein when the second bridge is in the calibration mode, the third, fourth, thirteenth, and fourteenth switches are open, and the seventh, eighth and eleventh switches are closed. In some embodiments, at least one of the current sources comprises at least one of: a resistive degenerated current source; and a cascode transistor. In some embodiments, at least one of the switches comprises at least one of: a T-switch; and a T-switch, wherein each gate of the T-switch is driven by independent inverter chains. In some embodiments, the adjustment circuit comprises at least one of: a chopper-stabilized differential amplifier; and first and second differential amplifiers, wherein the first differential amplifier adjusts the first adjustable current and the second differential amplifier operates in auto-zero mode when the first bridge is in calibration mode, and wherein the second differential amplifier adjusts the second adjustable current and the first differential amplifier operates in auto-zero mode when the second bridge is in calibration mode. Some embodiments comprise a control block adapted to generate first and second pulse-width modulated (PWM) control signals in response to a digital input signal, wherein the first switch operates in accordance with the first PWM control signal and the second switch operates in accordance with the second PWM control signal; an integrator adapted to integrate the current at the second output node in accordance with a feedback signal; and a comparator adapted to generate a comparison signal having a first logic level if an output signal of the integrator the integrator's output signal is greater than a reference signal and a second logic level if the output signal of the integrator the integrator's output signal is smaller than the reference signal. In some embodiments, the control block further generates a third PWM signal that is delayed with respect to the first PWM signal and a fourth PWM signal that is delayed with respect to the second PWM signal, the apparatus further comprising: a switch logic adapted to receive the third and fourth PWM signals and the comparison signal and to generate first, second and third driver control signals. Some embodiments comprise a driver adapted to receive the first, second and third driver control signals, the driver further comprising a first transistor adapted to deliver a first voltage to a second output node in response to the first driver control signal, a second transistor adapted to deliver a second voltage to the second output node in response to the second driver control signal, and a third transistor adapted to deliver a third voltage to the second output node in response to the third driver control signal, wherein the feedback signal is supplied by the second output node. In some embodiments, the first voltage is a positive supply voltage, the second voltage is a negative supply voltage, and the third voltage is the ground voltage. Some embodiments comprise a low-pass filter coupled to the second output node. In some embodiments, the control block comprises: an upsampler adapted to upconvert a sampling rate of the digital input signal. In some embodiments, the control block further comprises: a sampling point module adapted to identify cross sections of a sawtooth or a triangular signal with the upconverted digital input signal, the cross sections defining a first binary word. In some embodiments, the control block further comprises: a noise shaper adapted to receive the first binary word and generate a second binary word having fewer bits than the first binary word. In some embodiments, the control block further comprises: a pulse-width modulator adapted to generate the first, second, third and fourth PWM signals in accordance with the second binary word. In some embodiments, the pulse-width modulator further comprises: circuitry adapted to increase a width of each of the first, second, third and fourth PWM signals by a minimum pulse width. In some embodiments, the pulse-width modulator further comprises: circuitry adapted to subtract a pulse having the minimum width from of each of the first, second, third and fourth PWM signals. In some embodiments, the pulse-width modulator further comprises: circuitry adapted to increase a width of a pulse it generates by a minimum amount if the width of the pulse is less than a predefined value. In some embodiments, the pulse-width modulator further comprises: circuitry adapted to subtract a pulse having the minimum width from the pulse. In some embodiments, the digital input signal is a digital audio signal. In some embodiments, the digital input signal is a digital video signal. In some embodiments, the digital audio signal is compliant with Inter-IC Sound (I2S) specification. In some embodiments, the switch logic further comprises: first circuitry adapted to generate a pulse in response to a falling edge of the comparison signal. In some embodiments, the switch logic further comprises: second circuitry adapted to generate a pulse in response to a rising edge of the comparison signal. Some embodiments comprise a voltage-controlled oscillator (VCO) having an input coupled to the output node; a loop filter having an input connected to an output of the VCO; and a phase detector adapted to produce first and second control signals based on an input signal received as a positive input to the phase detector and an output of the loop filter received as a negative input to the phase detector; and wherein the first switch and second switches operate in accordance with the first and second control signals, respectively.

In general, in one aspect, an embodiment features a method comprising: switching a first combined current to an output node in accordance with a first input signal, wherein the first combined current comprises a first fixed current and a first adjustable current; switching a second fixed current to the output node in accordance with a second input signal, wherein the first combined current and the second fixed current are not switched to the output node simultaneously; and adjusting the first adjustable current based on the first combined current and the second fixed current.

Embodiments of the method can include one or more of the following features. In some embodiments, adjusting the first adjustable current based on the first combined current and the second fixed current comprises: switching the first combined current to a calibration node; switching the second fixed current to the calibration node; and adjusting the first adjustable current based on a voltage of the calibration node. In some embodiments, adjusting the first adjustable current based on the voltage of the calibration node comprises: comparing the voltage of the calibration node with a reference voltage; and adjusting the first adjustable current based on a difference between the voltage of the calibration node and the reference voltage. Some embodiments comprise switching the first combined current to a first dummy node when not switching the first combined current to the output node or the calibration node; and switching the second fixed current to the first dummy node when not switching the second fixed current to the output node or the calibration node. Some embodiments comprise operating a first bridge in an amplification mode while operating a second bridge in a calibration mode; and operating the second bridge in the amplification mode while operating the first bridge in the calibration mode; wherein operating the first bridge in the amplification mode comprises switching the first combined current to the output node in accordance with the first input signal, and switching the second fixed current to the output node in accordance with the second input signal; wherein operating the first bridge in the calibration mode comprises adjusting the first adjustable current based on the first combined current and the second fixed current; wherein operating the second bridge in the amplification mode comprises switching a second combined current to the output node in accordance with the first input signal, wherein the second combined current comprises a third fixed current and a second adjustable current, and switching a fourth fixed current to the output node in accordance with the second input signal, wherein the second combined current and the fourth fixed current are not switched to the output node simultaneously; and wherein operating the second bridge in the calibration mode comprises adjusting the second adjustable current based on the second combined current and the fourth fixed current. In some embodiments, adjusting the first adjustable current based on the first combined current and the second fixed current comprises switching the first combined current to a calibration node; switching the second fixed current to the calibration node; and adjusting the first adjustable current based on a voltage of the calibration node; and wherein adjusting the second adjustable current based on the second combined current and the fourth fixed current comprises switching the second combined current to the calibration node; switching the fourth fixed current to the calibration node; and adjusting the second adjustable current based on the voltage of the calibration node. In some embodiments, adjusting the first adjustable current based on the voltage of the calibration node comprises comparing the voltage of the calibration node with a reference voltage, and adjusting the first adjustable current based on a difference between the voltage of the calibration node and the reference voltage; and wherein adjusting the second adjustable current based on the voltage of the calibration node comprises comparing the voltage of the calibration node with a reference voltage, and adjusting the second adjustable current based on a difference between the voltage of the calibration node and the reference voltage. Some embodiments comprise switching the first combined current to a first dummy node when not switching the first combined current to the output node or the calibration node; switching the second fixed current to the first dummy node when not switching the second fixed current to the output node or the calibration node; switching the second combined current to a second dummy node when not switching the second combined current to the output node or the calibration node; and switching the second fixed current to the second dummy node when not switching the second fixed current to the output node or the calibration node. Some embodiments comprise generating first and second pulse-width modulated (PWM) control signals in response to a digital input signal, wherein the first combined current is switched to the first output node in accordance with the first PWM control signal and the second current is switched to the first output node in accordance with the second PWM control signal; generating a third signal in response to the first and second PWM control signals; integrating the third signal in accordance with a feedback signal; and generating a comparison signal having a first logic level if the integrated signal is greater than a reference signal and a second logic level if the integrated signal is smaller than the reference signal. Some embodiments comprise generating a third PWM signal that is delayed with respect to the first PWM signal; generating a fourth PWM signal that is delayed with respect to the second PWM signal; and generating first, second and third driver control signals in response to the third and fourth PWM signals and the comparison signal. Some embodiments comprise delivering a first voltage to a second output node in response to the first driver control signal; delivering a second voltage to the second output node in response to the second driver control signal; and delivering a third voltage to the second output node in response to the third driver control signal. In some embodiments, the first voltage is a positive supply voltage, the second voltage is a negative supply voltage and the third voltage is the ground voltage. Some embodiments comprise low-pass filtering the second output node's voltage. Some embodiments comprise upconverting a sampling rate of the digital input signal. Some embodiments comprise identifying cross sections of a sawtooth or a triangular signal with the upconverted digital input signal, the cross sections defining a first binary word. Some embodiments comprise noise shaping the first binary word to generate a second binary word having fewer bits than the first binary word. Some embodiments comprise generating the first, second, third and fourth PWM signals in accordance with the second binary word. Some embodiments comprise increasing a width of one or more of the first, second, third and fourth PWM signal by a minimum pulse width if the width of the one or more of the first, second, third and fourth PWM signals is detected as being smaller than a predefined value. Some embodiments comprise subtracting a minimum pulse width from the one or more of the first, second, third and fourth PWM signals having increased widths. Some embodiments comprise increasing a width of the first, second, third and fourth PWM signals by a minimum pulse width. Some embodiments comprise subtracting a minimum pulse width from the first, second, third and fourth PWM signals having increased widths. In some embodiments, the digital input signal is a digital audio signal. In some embodiments, the digital input signal is a digital video signal. In some embodiments, the digital audio signal is compliant with Inter-IC Sound (I2S) specification. Some embodiments comprise generating a pulse in response to a falling edge of the comparison signal. Some embodiments comprise generating a pulse in response to a rising edge of the comparison signal.

In general, in one aspect, an embodiment features an apparatus comprising: first fixed current source means for producing a first fixed current; second fixed current source means for producing a second fixed current; first adjustable current source means for producing a first adjustable current; first switch means for delivering the first fixed current and the first adjustable current to a first output node when the first switch means is closed; second switch means for delivering the second fixed current to the first output node when the second switch means is closed; and adjustment means for adjusting the first adjustable current according to the first fixed current, the second fixed current, and the adjustable current.

Embodiments of the apparatus can include one or more of the following features. Some embodiments comprise third switch means for delivering the first fixed current and the first adjustable current to a calibration node when the third switch means is closed; and fourth switch means for delivering the second fixed current to the calibration node when the fourth switch means is closed; wherein the adjustment means adjusts the first adjustable current according to a voltage at the calibration node when the third and fourth switch means are closed. In some embodiments, the adjustment circuit comprises: comparator means for producing a calibration voltage at a comparator output, the calibration voltage based on a reference voltage and a voltage at the calibration node when the third and fourth switch means are closed; and fifth switch means for coupling the comparator output and a control input of the first adjustable current source means when the fifth switch means is closed, wherein the first adjustable current source means adjusts the first adjustable current in accordance with the control input. In some embodiments, when the apparatus is in an amplification mode, the first and second switch means operate according to respective first and second input signals, and the third, fourth, and fifth switch means are open; and when the apparatus is in a calibration mode, the third, fourth, and fifth switch means are closed, and the first and second switch means are open. Some embodiments comprise sixth switch means for delivering the first fixed current and the first adjustable current to a dummy node when the sixth switch means is closed; and seventh switch means for delivering the second fixed current to the dummy node when the seventh switch means is closed; wherein when the apparatus is in the amplification mode, the sixth switch means is open when the first switch means for is closed and closed when the first switch means is open, and the seventh switch means for is open when the second switch means is closed and closed when the second switch means is open. Some embodiments comprise first means for bridging comprising the first fixed current source means, the second fixed current source means, the first adjustable current source means, the first switch means, and the second switch means; and second means for bridging comprising third current source means for producing a third current, fourth current source means for producing a fourth current, second adjustable current source means for producing a second adjustable current, third switch means for delivering the third current and the second adjustable current to the first output node when the third switch means is closed, and fourth switch means for delivering the fourth current to the first output node when the fourth switch means is closed; wherein the first means for bridging is in an amplification mode when the second means for bridging is in a calibration mode, and the second means for bridging is in the amplification mode when the first means for bridging is in the calibration mode; wherein the adjustment means adjusts the first adjustable current when the first means for bridging is in the calibration mode; and wherein the adjustment means for bridging adjusts the second adjustable current according to the third current, the fourth current, and the second adjustable current when the second means for bridging is in the calibration mode. Some embodiments comprise fifth switch means for delivering the first fixed current and the first adjustable current to a calibration node when the fifth switch means is closed; and sixth switch means for delivering the second fixed current to the calibration node when the sixth switch means is closed; seventh switch means for delivering the third current and the second adjustable current to the calibration node when the seventh switch means is closed; and eighth switch means for delivering the fourth current to the calibration node when the eighth switch means is closed; wherein the fifth and sixth switch means are closed and the seventh and eighth switch means are open when the first means for bridging is in the calibration mode and the second means for bridging is in the amplification mode; and wherein the fifth and sixth switch means are open and the seventh and eighth switch means are closed when the first means for bridging is in the amplification mode and the second means for bridging is in the calibration mode. In some embodiments, the adjustment means comprises: comparator means for producing a calibration voltage at a comparator output, the calibration voltage based on a reference voltage and a voltage at the calibration node; ninth switch means for coupling the comparator output and a control input of the first adjustable current source means when the ninth switch means is closed, wherein the first adjustable current source means adjusts the first adjustable current in accordance with the control input of the first adjustable current source means; and tenth switch means for coupling the comparator output and a control input of the second adjustable current source means when the tenth switch is closed, wherein the second adjustable current source means adjusts the second adjustable current in accordance with the control input of the second adjustable current source means. Some embodiments comprise eleventh switch means for delivering the first fixed current and the first adjustable current to a first dummy node when the eleventh switch means is closed; twelfth switch means for delivering the second fixed current to the first dummy node when the twelfth switch means is closed; thirteenth switch means for delivering the third current and the second adjustable current to a second dummy node when the thirteenth switch means is closed; fourteenth switch means for delivering the fourth current to the second dummy node when the fourteenth switch means is closed; wherein when the first means for bridging is in the amplification mode, the eleventh switch means is open when the first switch means is closed and closed when the first switch means is open, and the twelfth switch means is open when the second switch means is closed and closed when the second switch means is open; wherein when the second means for bridging is in the amplification mode, the thirteenth switch means is open when the third switch means is closed and closed when the third switch means is open, and the fourteenth switch means is open when the fourth switch means is closed and closed when the fourth switch means is open; wherein when the first means for bridging is in the calibration mode, the first, second, eleventh, and fourteenth switch means are open, and the fifth, sixth and ninth switch means are closed; and wherein when the second means for bridging is in the calibration mode, the third, fourth, thirteenth, and fourteenth switch means are open, and the seventh, eighth and eleventh switch means are closed. Some embodiments comprise control means for generating first and second pulse-width modulated (PWM) control signals in response to a digital input signal, wherein the first switch means operates in accordance with the first PWM control signal and the second switch means operates in accordance with the second PWM control signal; integrator means for integrating the current at the second output node in accordance with a feedback signal; and comparator means for generating a comparison signal having a first logic level if an output signal of the integrator means is greater than a reference signal and a second logic level if the output signal of the integrator means is smaller than the reference signal. In some embodiments, the control means further generates a third PWM signal that is delayed with respect to the first PWM signal and a fourth PWM signal that is delayed with respect to the second PWM signal, the apparatus further comprising: switch logic means for receiving the third and fourth PWM signals and the comparison signal, and for generating first, second and third driver control signals. Some embodiments comprise driver means for receiving the first, second and third driver control signals, the driver means further comprising first transistor means for delivering a first voltage to a second output node in response to the first driver control signal, second transistor means for delivering a second voltage to the second output node in response to the second driver control signal, and third transistor means for delivering a third voltage to the second output node in response to the third driver control signal, wherein the feedback signal is supplied by the second output node. In some embodiments, the first voltage is a positive supply voltage, the second voltage is a negative supply voltage, and the third voltage is the ground voltage. Some embodiments comprise means for low-pass filtering coupled to the second output node. In some embodiments, the control means comprises: upsampler means for upconverting a sampling rate of the digital input signal. In some embodiments, the control means further comprises: sampling point means for identifying cross sections of a sawtooth or a triangular signal with the upconverted digital input signal, the cross sections defining a first binary word. In some embodiments, the control means further comprises: noise shaper means for receiving the first binary word, and for generating a second binary word having fewer bits than the first binary word. In some embodiments, the control means further comprises: pulse-width modulator means for generating the first, second, third and fourth PWM signals in accordance with the second binary word. In some embodiments, the pulse-width modulator means further comprises: means for increasing a width of each of the first, second, third and fourth PWM signals by a minimum pulse width. In some embodiments, the pulse-width modulator means further comprises: means for subtracting a pulse having the minimum width from of each of the first, second, third and fourth PWM signals. In some embodiments, the pulse-width modulator means further comprises: means for increasing a width of a pulse by a minimum amount if the width of the pulse is less than a predefined value. In some embodiments, the pulse-width modulator means further comprises: means for subtracting a pulse having the minimum width from the pulse. In some embodiments, the digital input signal is a digital audio signal. In some embodiments, the digital input signal is a digital video signal. In some embodiments, the digital audio signal is compliant with Inter-IC Sound (I2S) specification. In some embodiments, the switch logic means further comprises: first means for generating a pulse in response to a falling edge of the comparison signal. In some embodiments, the switch logic means further comprises: second means for generating a pulse in response to a rising edge of the comparison signal.

The details of one or more implementations are set forth in the accompanying drawings and the description below. Other features will be apparent from the description and drawings, and from the claims.

DETAILED DESCRIPTION

Embodiments disclosed herein provide current-mode three-level digital amplifiers that feature techniques for reducing mismatches between the current sources in the amplifiers. For example, an adjustable current source can operate in parallel with one of the other current sources, and can be adjusted automatically to compensate for mismatches between the other current sources. Some embodiments provide two bridges connected in parallel. While one bridge operates normally the other bridge is calibrated for subsequent operation. Other features are provided as well, as described in detail below.

Figure 1:
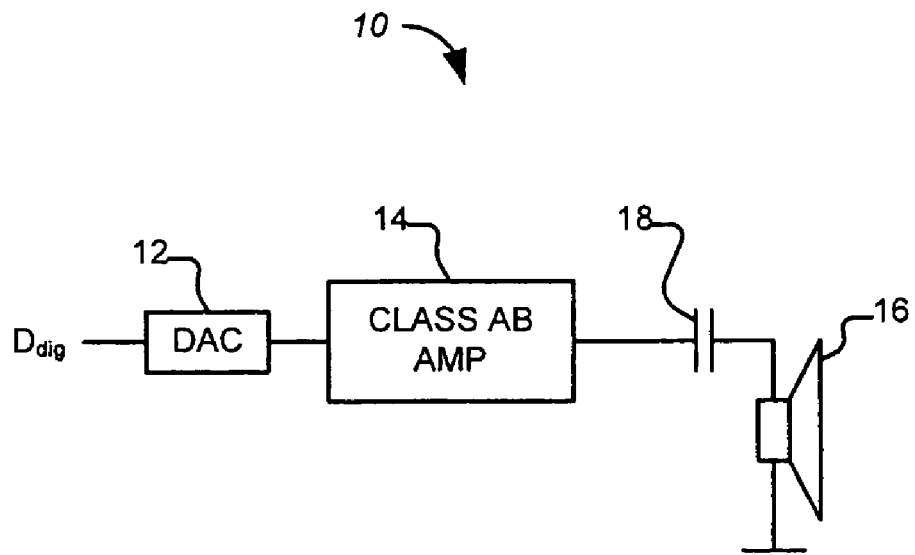
FIG. 1 is a functional block diagram of a Class AB amplifier, as known in the prior art.
Figure 3:
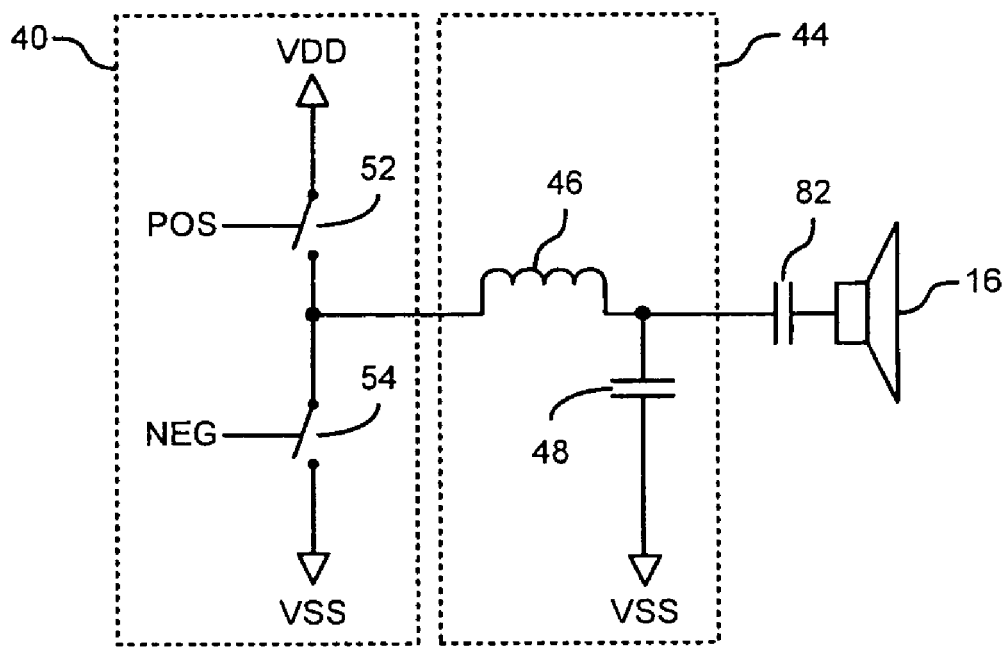
FIG. 3 is a schematic diagram of the driver disposed in the amplifier of FIG. 2, as known in the prior art.
Figure 2:
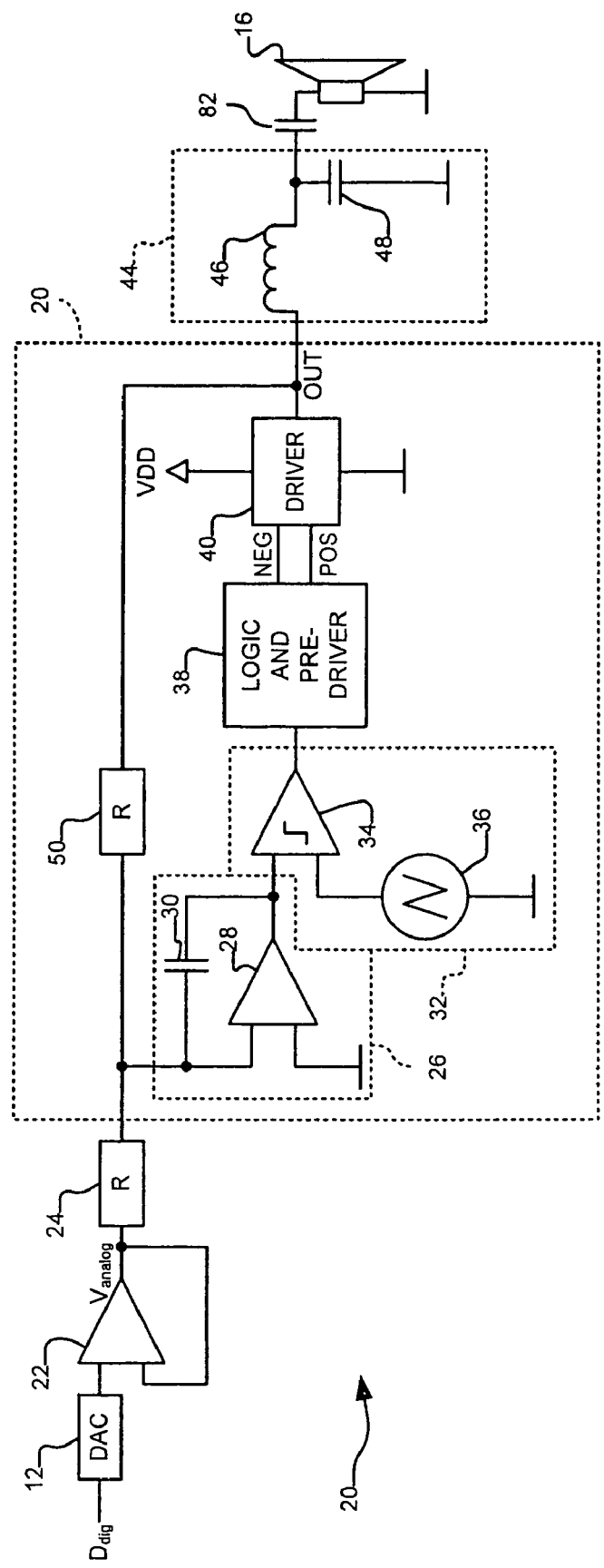
FIG. 2 is a functional block diagram of a Class D amplifier, as known in the prior art.
Figure 4:
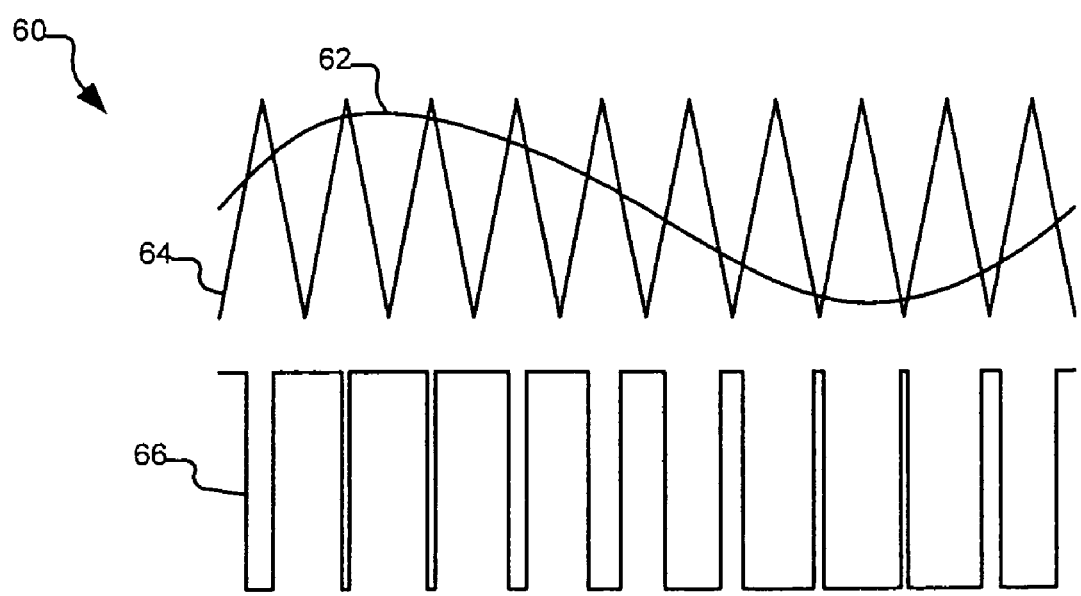
FIG. 4 is timing diagram of the input/output signals of the comparator disposed in the amplifier of FIG. 2, as known in the prior art.
Figure 5:
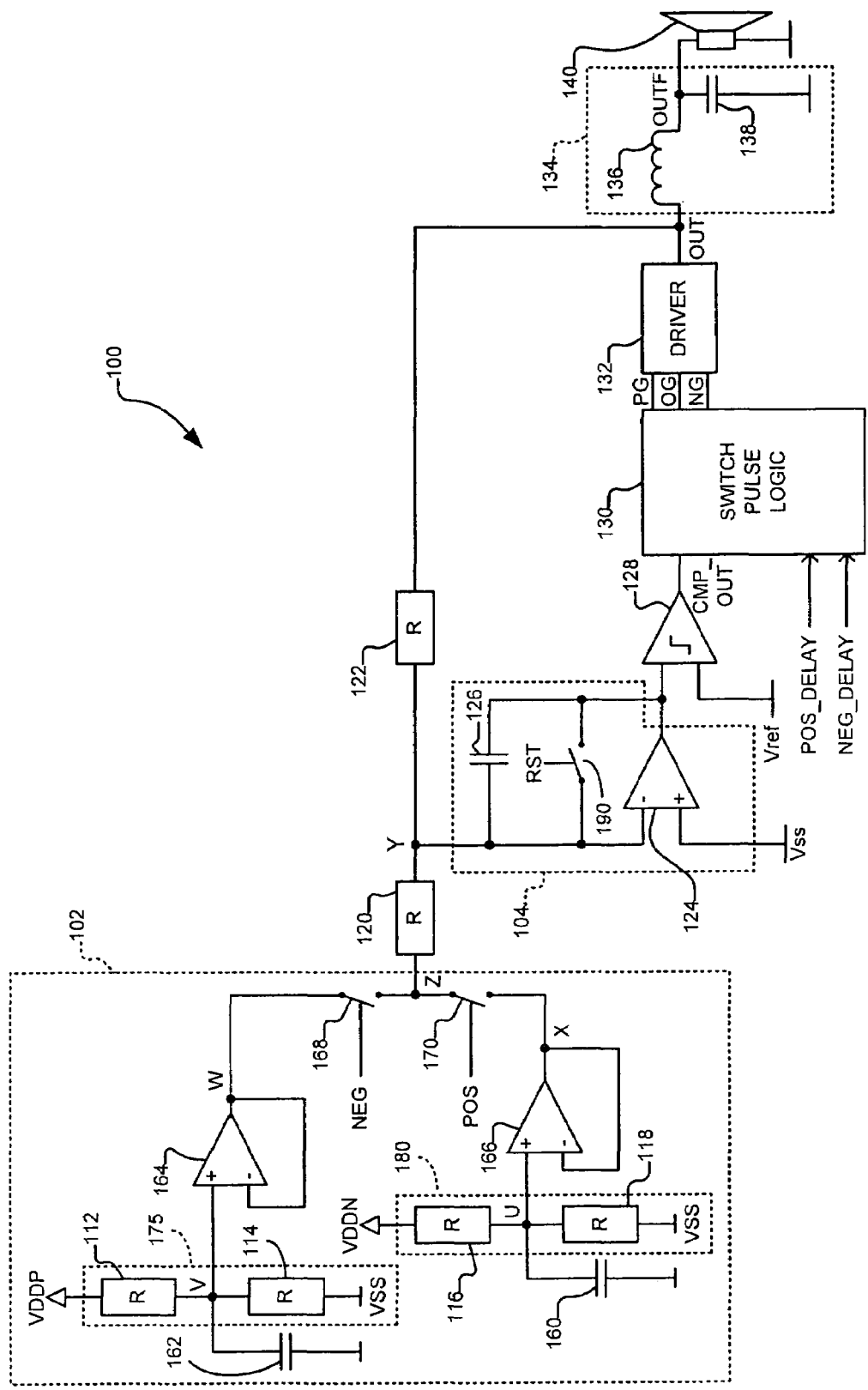
FIG. 5 is a functional block diagram of an amplifier, in accordance with one embodiment.

FIG. 5 is a block diagram of an amplifier 100 that provides a tri-level output signal, in accordance with one embodiment. The following description is provided with reference to using amplifier 100 in audio applications. It is understood, however, that amplifier 100 may also be used in many other applications, such as in processing video information, etc.

Signal generator, also referred to herein as signal source, 102 is shown as including voltage dividers 175, 180, capacitors 160, 162, operational amplifiers 164, 166 and switches 168 and 170. In response to signals POS and NEG applied to switches 168 and 170, current is either sourced to or drawn from output node Z of signal source 102. In some embodiments, switches 168 and 170 may be transistor switches.

Voltage divider 175 includes resistive loads 112 and 114 that are disposed between positive supply voltage VDDP and a reference voltage Vss. Reference voltage Vss may be the ground voltage. The inverting input of operational amplifier (op-amp) 164 is coupled to its output. Op-amp 164 generates a voltage at node W that is maintained substantially at the same potential as that at node V. Capacitor 162 attenuates the high frequency components of noise present at node V. Voltage divider 180 includes resistive loads 116 and 118 that are disposed between negative supply voltage VDDN and the reference voltage Vss. The inverting input of op-amp 166 is coupled to its output. Op-amp 166 generates a voltage at node X that is maintained substantially at the same potential as that at node U. Capacitor 160 attenuates the high frequency components of any noise present at node U. In some embodiments the feedback path between the input and output terminals of op-amps 164 and 166 may include a resistor or a compensation network. When signal NEG is asserted, signal POS is deasserted, accordingly the voltage at node W is supplied to node Z. Conversely, when signal POS is asserted, signal NEG is deasserted, accordingly the voltage at node X is supplied to node Z. The signal supplied to node Z by signal source 102 has a substantially attenuated noise component.

Figure 6:
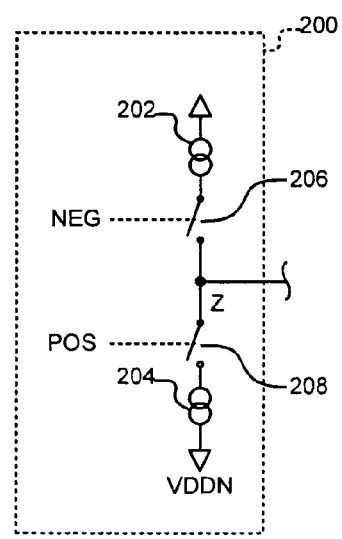
FIG. 6 is a functional block diagram of an exemplary signal generator adapted to supply a signal to the amplifier of FIG. 5, in accordance with one embodiment.

FIG. 6 is a schematic diagram of another exemplary embodiment 200 of a signal source that may be used in place of signal source 102 and resistor 120 of FIG. 5. Signal source 200 is shown as including current sources 202, 204 and switches 206, 208. Switch 206 that receives signal NEG is disposed between current source 202 and node Y, shown in FIG. 5. Similarly, switch 208 that receives signal POS is disposed between current source 204 and node Y. When signal NEG is asserted, the current supplied by current source 202 flows to node Y. When signal POS is asserted, the current supplied by current source 204 flows to node Y.

Figure 7:
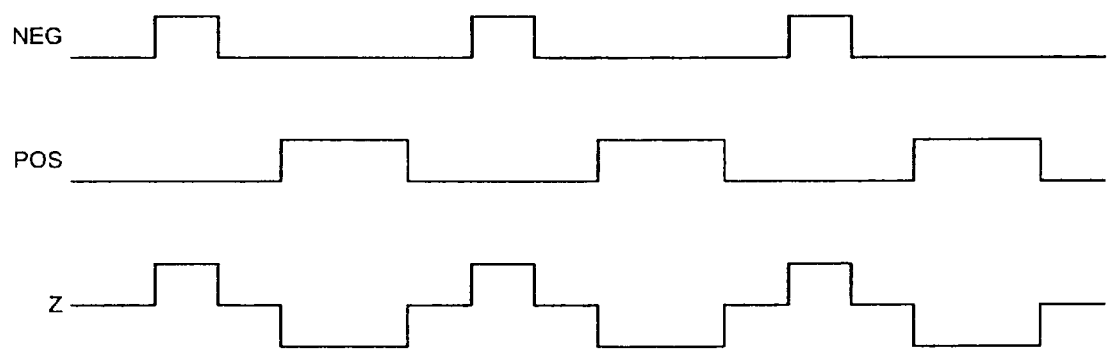
FIG. 7 is a timing diagram of a number of signals associated with the amplifier of FIG. 5, in accordance with one embodiment.

FIG. 7 is a timing diagram of voltage signals POS, NEG as well as the voltage signal supplied to node Z. Referring to FIGS. 6 and 7 concurrently, when signal POS is at a high level, the voltage at node Z corresponds to the voltage at node X, and when signal NEG is at a high level, the voltage at node Z corresponds to the voltage at node W. When signals POS and NEG are both at zero levels, signal Z is also at the reference voltage Vss, e.g., zero volts. In one embodiment, supply voltages VDDP and VDDN are respectively at +1.5 volts and −1.5 volts. Accordingly, in such embodiments, the voltage at node Z varies between zero volts and a fraction of ±1.5 volts.

Referring to FIG. 5, the signal present at node Z is delivered to an input terminal of op-amp 124 via resistor 120. The other input terminal of op-amp 124 is coupled to a reference voltage VSS that may or may not be the ground potential. Feedback capacitor 126, disposed between input and output terminals of op-amp 124, is discharged when signal RST applied to switch 190 is asserted. Op-amp 124 together with capacitor 126 form an integrator 104. Op-amp 124 may be powered by supply voltages VDDP and VDDN.

The output signal of integrator 104 is applied to a first terminal of comparator 128 whose other terminal receives reference voltage Vref. In some embodiments, voltage Vref may be the ground potential. If the voltage supplied by integrator 104 is greater than reference voltage Vref, the output signal of comparator 128 is set to a high level, and if the voltage supplied by integrator 104 is smaller than reference voltage Vref, the output signal of comparator 128 is set to a low level. Comparator 128 may be powered by supply voltages VDDP and VDDN.

Switch pulse logic 130 receives the output signal of comparator 128 as well as the pulse-width modulated (PWM) signals POS_DELAY and NEG_DELAY, and in response generates control signals NG, PG and OG that are applied to driver 132. Driver 132 generates a tri-level output signal OUT in response to control signals NG, PG and OG that it receives. In one embodiment, such as that shown in FIG. 5, signal OUT is applied to a low pass filter 134, shown as including an inductor 136 and a capacitor 138. It is understood, however, that other low-pass filters may be used. The filtered output signal OUTF is applied to speaker 140. Signal OUT is fed back to the inverting terminal of op-amp 124 via resistive load 122. In some embodiments (not shown), an inductor and a capacitor internal to speaker 140 is used to filter out signal OUT. Accordingly in such embodiments, signal OUT is applied to directly to speaker 140 or a headphone. Amplifier 100 is filterless. Furthermore, since the DC level of the voltage signal supplied by amplifier 100 does not need to be shifted with respect to a reference DC voltage, amplifier 100 is DC free. In other words, to deliver, for example, 1.5 volts, the output voltage of amplifier 100 is set to 1.5 volts and not to another DC voltage level.

Figure 8:
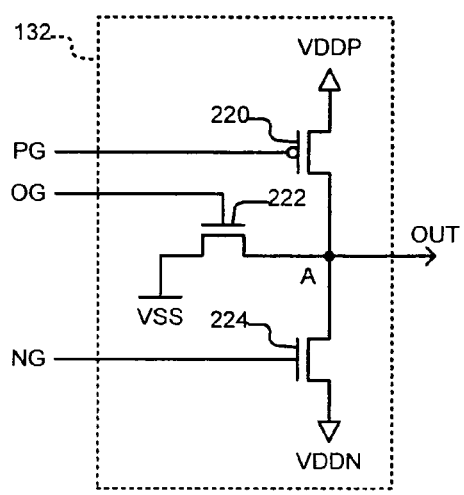
FIG. 8 is a schematic diagram of an exemplary driver disposed in the amplifier of FIG. 5, in accordance with one embodiment.

FIG. 8 is a transistor schematic diagram of an exemplary embodiment of driver 132. Driver 132 is shown as including transistors 220, 222 and 224 that respectively receive signals PG, OG and NG at their gate terminals. When signal PG is at a low level, signals NG and OG are at a high level. Accordingly, PMOS transistor 220 is on and NMOS transistor 222 and 224 are off. Therefore, node A is pulled to the positive supply voltage VDDP. When signals PG and NG are at a high level, signal OG is at a low level. Accordingly, transistor 224 is on and transistors 220 and 222 are off. Therefore, node A is pulled to the negative supply voltage VDDN. When signal PG is at a high level and signal NG is at a low level, signal OG is at a high level. Therefore, node A is pulled to the supply voltage Vss. Consequently, driver 132 is adapted to vary the voltage at node A between supply voltages VDDP, VDDN and Vss. In other words, driver module 132 generates a tri-level output signal by only turning on one of the transistors 220, 222 and 224 at any given time.

The feedback loop from the output of driver 132 to the input of op-amp 124 provides a number of advantages. First, the feedback loop attempts to compensate for the finite switch resistance at output node A of driver 132. Ideally, the switch resistance seen by node A should be as small as possible, e.g., 0 ohms, to enable node A to pulled to supply voltages VDDP, VDDN and Vss as closely as possible. Second, the feedback loop compensates for the voltage overshoot and undershoot at node A during blanking times, as described further below. To prevent current flow from the positive voltage supply to the negative voltage supply, any of the transistors 220, 222 and 224 that is on during one cycle is first turned off before another one of these transistors is turned on during the next cycle. The time period between turning off of a transistor and turning on of another transistor in an output driver is referred to as the blanking time.

Referring to FIGS. 5 and 8 concurrently, when, for example, transistor 220 is turned off, the current flow through the inductive load 136 seen by node A does not change instantaneously. This causes the voltage at node A to increase, causing a supply overshoot. The overshoot causes the source-to-bulk diode of transistor 220 to turn on. Once this diode is turned on, the voltage at node A is clamped at one PN junction diode above the VDDP voltage. Similarly, a voltage undershoot can occur during switching of transistor 224. As described above, the feedback loop compensates for the supply voltage overshoot and undershoot at output node A. Third, the feedback loop helps achieve power supply rejection. In other words, the feedback loop rejects variations in the voltage at node A that may arise due to variations in supply voltages VDPP and VDDN.

Figure 9:
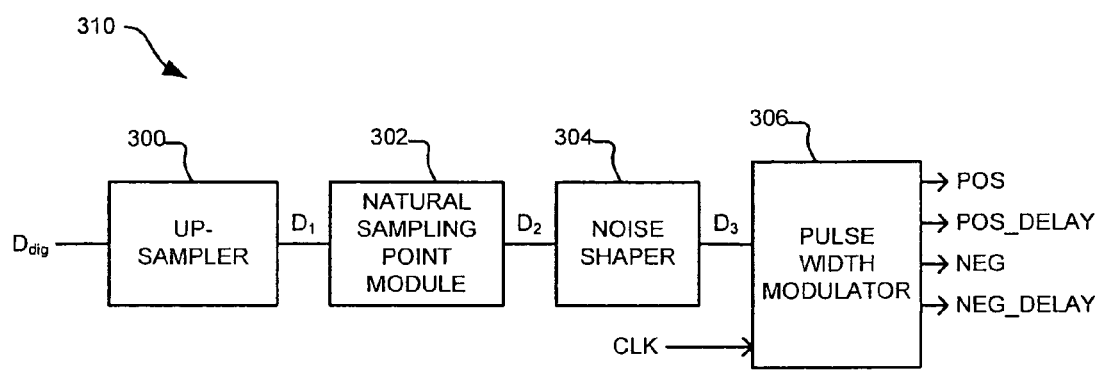
FIG. 9 is a diagram of exemplary logic blocks used to control the amplifier of FIG. 5, in accordance with one embodiment.

FIG. 9 shows various components of a control block 310 adapted to control amplifier 100 of FIG. 5. In response to the digital audio signal $D_{dig}$, control block 310 generates signals POS, NEG, POS_DELAY and NEG_DELAY that are applied to amplifier 100 shown in FIG. 5. In some embodiments, the audio signal $D_{dig}$ is compliant with an $I^2S$ (Inter-IC Sound) bus specification published by Philips Corporation; this specification is hereby incorporated by reference in its entirety. In some embodiments, the audio signal $D_{dig}$ may include audio samples between about 8 KHz and 192 KHz.

Up-sampler 300 upconverts the sampling rate of signal $D_{dig}$. In one embodiment, signal $D_{dig}$ has a sampling rate of, for example, 48 KHz and signal $D_1$ supplied by up-sampler 300 has a sampling rate of, for example, 384 KHz. Natural sampling point module 302 identifies the cross sections of a sawtooth/triangular signal and the up-sampled signal D1 to generate a digitized word $D_2$. In one embodiment, $D_2$ is, for example, a 20-bit word and thus a clock signal of, for example, 400 GHz clock would be required to process the, e.g., 20-bit word $D_2$.

To dispense the need for such a high frequency clock, e.g., a 400 GHz clock, signal $D_2$ is applied to noise shaper 304 which enables pulse-width modulator 306 to use a slower clock, e.g., a 480 MHz clock. Noise shaper 304 performs a bit-reduction algorithm and spreads the quantization error around so that more of the error is focused on higher inaudible frequencies. The result is that where human ear is most sensitive, the quantization error is reduced, and where human ear is less sensitive, the noise is greater. In one embodiment noise shaper 304, reduces the number of bits in signal $D_2$ from, e.g., 20 bits to generate signal $D_3$ that has, e.g., 8-bits. Some embodiments do not include a noise shaper. In such embodiments, the output signal $D_2$ of natural sampling module 302 is applied directly to pulse-width modulator 306.

Figure 10:
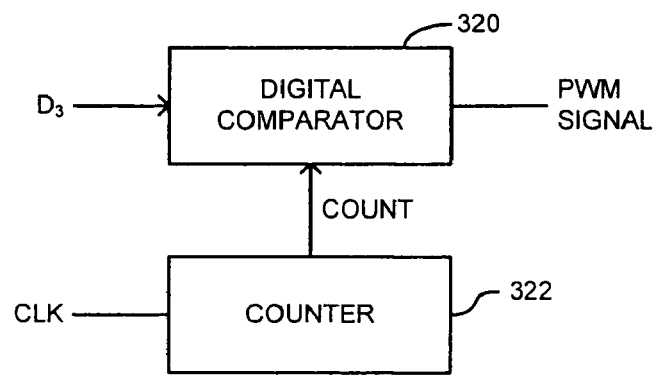
FIG. 10 is a block diagram of a number of components adapted to generate a pulse-width modulated signal.
Figure 11:
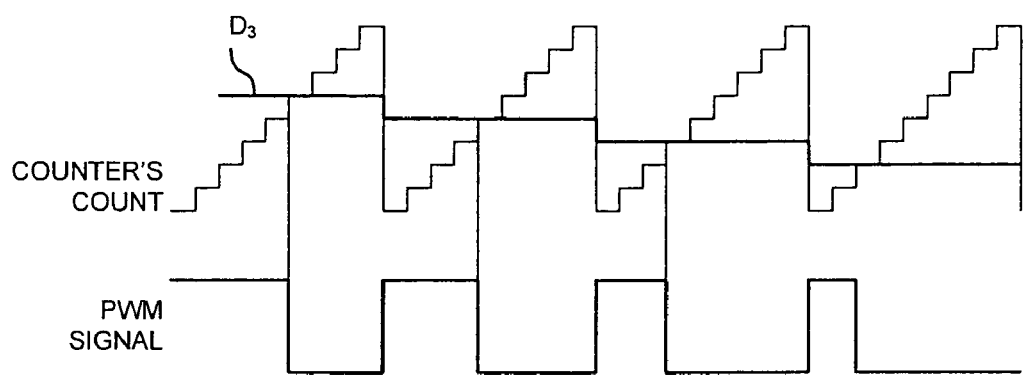
FIG. 11 is an exemplary timing diagram of the signals associated with the pulse-width modulator of FIG. 10.

Pulse width modulator 306 includes one or more counters and one or more digital comparators that generate pulse-width modulated signals POS, NEG, POS_DELAY and NEG_DELAY. FIG. 10 is a block diagram of a counter 322 coupled to a digital comparator 320 adapted to generate a pulse-width modulated signal. Counter 322 increments its count with each transition of clock signal CLK. The count of counter 322 establishes the comparison value of comparator 320. When signal $D_3$ is greater than the counter's count, comparator 320 generates a logic high signal, and when signal $D_3$ is smaller than the counter's count, comparator 320 generates a logic low signal. Accordingly, the width of the pulses generated by comparator 320 is modulated in accordance with signal $D_3$ and the counter's count. FIG. 11 is an exemplary timing diagram of the counter 320's count, signal $D_3$ and the resulting pulse-width modulated signal.

Signal POS_DELAY has a phase delay with respect to signal POS. In some embodiment, the delay between phases of signals POS and POS_DELAY is fixed. In other embodiments, the delay between phases of signals POS and POS_DELAY is programmable and thus may be varied. Similarly, signal NEG_DELAY has a phase delay with respect to signal NEG. In some embodiment, the delay between phases of signals NEG and NEG_DELAY is fixed. In other embodiments, the delay between phases of signals NEG and NEG_DELAY is programmable and thus may be varied.

A pulse with a width that is less than a threshold value may not be properly transferred. Accordingly, in some embodiments, the width of each pulse generated by pulse width modulator 306 is increased by a predefined minimum width. In yet other embodiments, only the widths of pulses that are less than a previously established threshold value are increased by a predefined minimum width. The width added to a pulse is subsequently removed during the next pulse. The minimum width is added at the center of the sawtooth signal, such as the digitized sawtooth signal shown in FIG. 11. In other words, the place where the minimum width is added is independent of the value of signal $D_3$. Similarly, the minimum width added to each pulse is also independent of the pulse that it is added to. In other words, the width added to each pulse is also independent of the value of signal $D_3$. When the signal sign changes from positive to negative, the sign of the minimum width also flips from positive to negative. By adding the minimum pulse width to each pulse or to pulses satisfying a predefined condition, it is guaranteed that all the pulses are transferred properly.

Figure 12A:
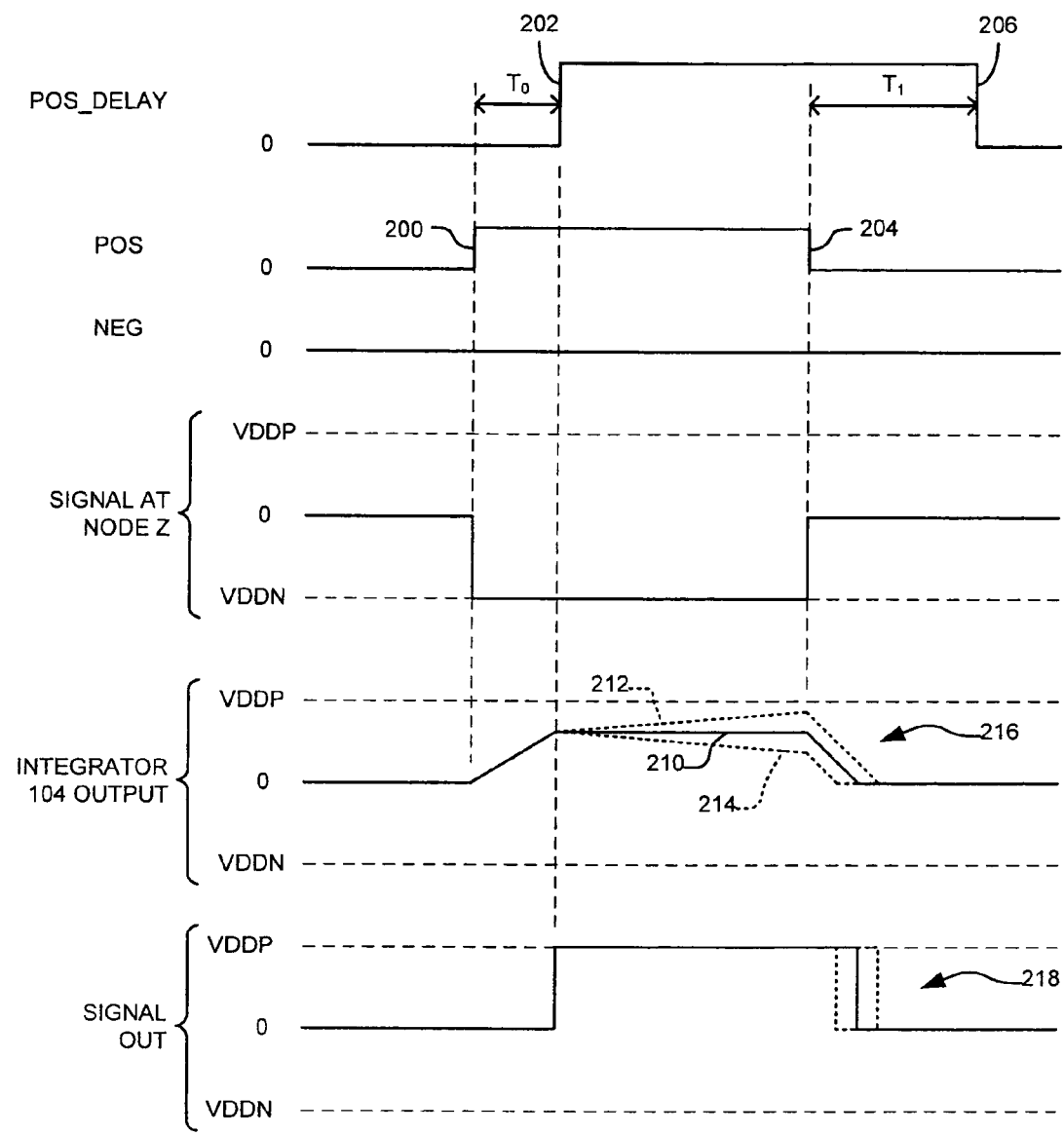
FIGS. 12A-12B are exemplary timing diagrams of a number of signals associated with the amplifier of FIG. 5.

FIG. 12A is a timing diagram example of a number of signals associated with amplifier 100, shown in FIG. 5. In accordance with this timing diagram, a positive pulse from 0 to VDDP is generated by output driver 132, i.e., signal OUT. The process of generating the positive pulse begins at time 200. At time 200, pulse width modulator 306 causes signal POS signal to go high, thereby causing switch 170 to close. Signal NEG remains low to keep switch 168 open. The width (duration) of pulse signal POS is determined based on data $D_3$ received from noise shaper 304, as described above. After the elapse of time period $T_0$, pulse width modulator 306 causes signal POS_DELAY to make a low-to-high transition at time 202. During the period $T_0$, the output voltage of driver 132 is at the ground potential, therefore, integrator 104 integrates only the signal it receives from signal source 102 and its output increases during this time. Because signal POS is at a high level during this time, the voltage supplied to integrator 104 via node Z is supplied by voltage divider 180 and op-amp 166.

When signal POS_DELAY makes a low-to-high transition at time 202, signals PG, NG and OG go low. This causes transistor 220 to turn on and transistors 222 and 224 to be off, in turn causing output signal OUT carried by node A to be pulled to VDDP. The high voltage at node A is applied to integrator 104 via feedback resistor 122. From time 202, when signals POS_DELAY makes a low-to-high transition, until time 204, when signal POS makes a high-to-low transition, integrator 104 integrates the difference between the signals supplied by signal source 102 at node Z, and the signal received from feedback resistor 122. If this difference is zero, the output of integrator 104 remains generally flat as shown at 210. If this difference is positive, the output of integrator 104 increases as shown at 212. If this difference is negative, the output of integrator 104 decreases as shown at 214.

Pulse width modulator 306 returns signals POS and POS_DELAY to zero at times 204 and 206, respectively. In some embodiment, the delay $T_1$—between the times 206 and 204—is twice the delay $T_0$—between the times 202 and 200. In some embodiments, delays $T_0$ and $T_1$ are fractions of the width of signal POS. Time delays $T_0$ and $T_1$ provide integrator 104 with sufficient time to integrate and discharge, respectively, without causing comparator 128 to generate a multitude of signal transitions, or to go into saturation. Saturation refers to a condition according to which the integrator's output tries either to reach or exceed the maximum possible output voltage or to reach or go below a minimum possible output voltage.

At time 204 the output of integrator 104 begins to fall at decay rate 216. The duration of the decay depends on the level of the integrator 104 output voltage signal at time 204. At time 218 the output signal from integrator 104 is assumed to cross the constant reference signal of comparator 128. The output of comparator 128 thus switches, in turn causing signal OUT generated by driver 132 to be lowered from VDDP to the ground potential. Occurrence of time 218 is dependent on the level of output signal of integrator 104 at time 204 and decay rate 216. Integrator 104 therefore adjusts the duration of signal OUT to accommodate for fluctuations in the supply voltages VDDP, VDDN, the voltage drops across transistor switches 220 and 224 of driver 132, and overshoots and undershoots of signal OUT. Integrator 104 therefore adjusts the duration of signal OUT such that the area covered by signal OUT is approximately constant for a given $D_3$ received from noise shaper 176.

Figure 12B:
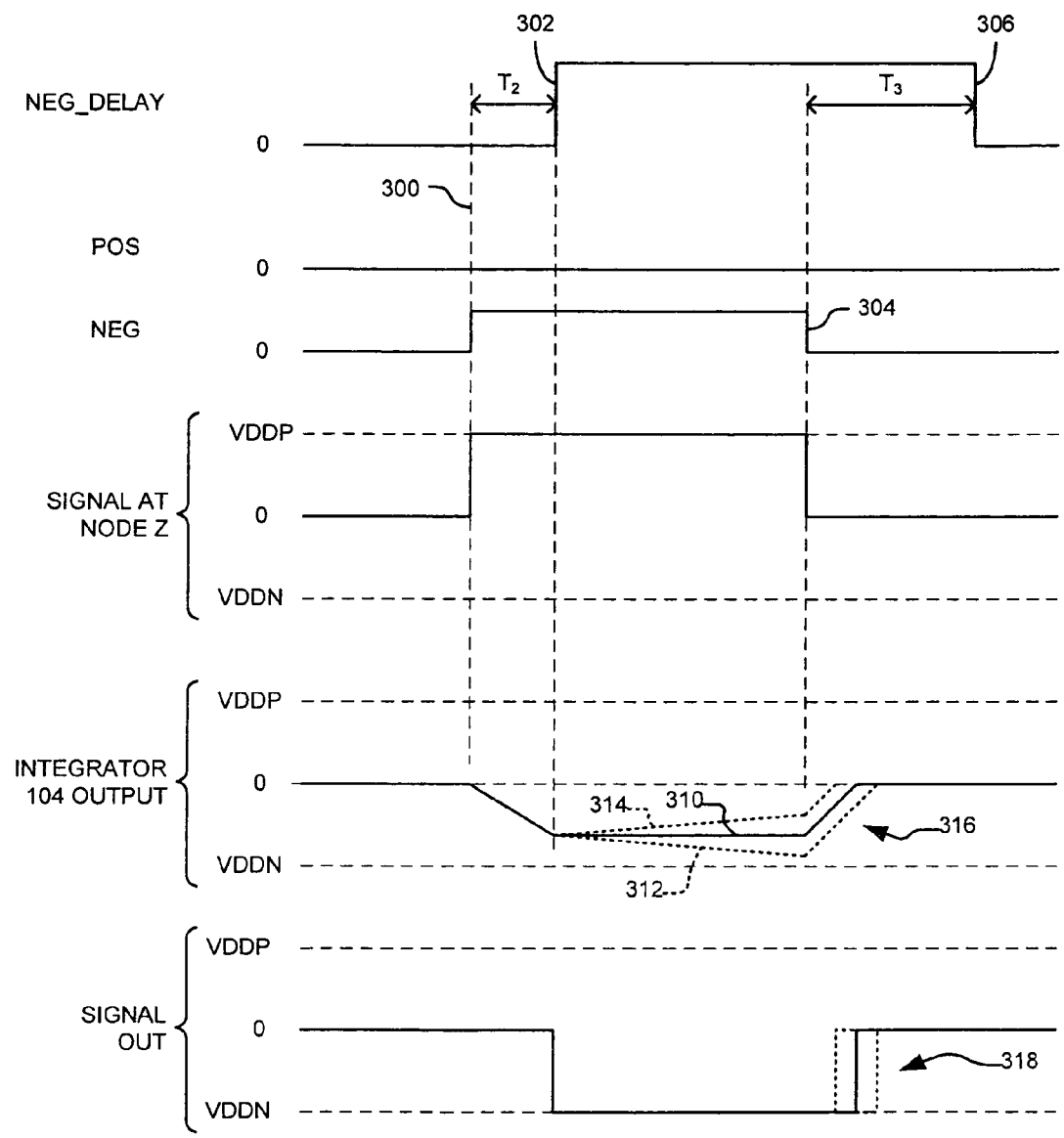

FIG. 12B is an exemplary timing diagram of a number of signals associated with amplifier 100, shown in FIG. 5. In accordance with this timing diagram, a negative pulse from 0 to VDDN is generated by output driver 132. The process of generating the negative pulse begins at time 300. At time 300, pulse-width modulator 306 causes signal NEG to go high, thereby causing switch 168 to close. Signal POS remains low to keep switch 170 open. The width (duration) of pulse signal NEG is determined based on data $D_3$ received from noise shaper 304, as described above. After an elapse of time period $T_2$, pulse-width modulator 306 causes signal NEG_DELAY to make a low-to-high transition at time 302. During the period $T_2$, the output voltage of driver 132 is at the ground potential, therefore, integrator 104 integrates only the signal it receives from signal source 102, therefore its output voltage decreased during this time. Because signal NEG is at a high level during this time, the voltage supplied to integrator 104 via node Z is supplied by voltage divider 175 and op-amp 164.

When signal NEG_DELAY makes a low-to-high transition at time 302, signal OG goes low and signal NG goes high. This causes transistor 222 to turn off and transistor 224 to turn on, in turn causing output signal OUT carried by node A to be pulled low to negative supply voltage VDDN. The voltage VDDN at node A is applied to integrator 104 via feedback resistor 122. From time 302, when signals NEG_DELAY makes a low-to-high transition, until time 304, when signal NEG makes a high-to-low transition, integrator 104 integrates the difference between the signals supplied by signal source 102 at node Z, and the signal received from feedback resistor 122. If this difference is zero, the output of integrator 104 remains generally flat as shown at 210. If this difference is positive, the output of integrator 104 decreases as shown at 312. If this difference is negative, the output of integrator 104 decreases as shown at 314.

Pulse width modulator 306 returns signals NEG and NEG_DELAY to zero at times 304 and 306, respectively. In some embodiment, the delay $T_3$—between the times 306 and 304—is twice the delay $T_2$—between the times 302 and 300. In some embodiments, delays $T_2$ and $T_3$ are fractions of the width of signal NEG. Time delays $T_2$ and $T_3$ provide integrator 104 with sufficient time to integrate and discharge, respectively, without causing comparator 128 to generate a multitude of signal transitions.

At time 304 the output of integrator 104 begins to rise at a decay rate 316. The duration of the rise depends on the level of the integrator 104 output voltage signal at time 304. At time 318 the output signal from integrator 104 is assumed to cross the constant reference signal of comparator 128. The output of comparator 128 thus switches, in turn causing signal OUT generated by driver 132 to be raise from VDDN to the ground potential. Occurrence of time 318 is dependent on the level of output signal of integrator 104 at time 304 and decay rate 316. Integrator 104 therefore adjusts the duration of signal OUT to accommodate for fluctuations in the supply voltages VDDP, VDDN, and the voltage drops across transistor switches 220 and 224 of driver 132. Integrator 104 therefore adjusts the duration of signal OUT such that the area covered by the duration of signal OUT is approximately constant for a given signal $D_3$ received from noise shaper 176.

Figure 13A:
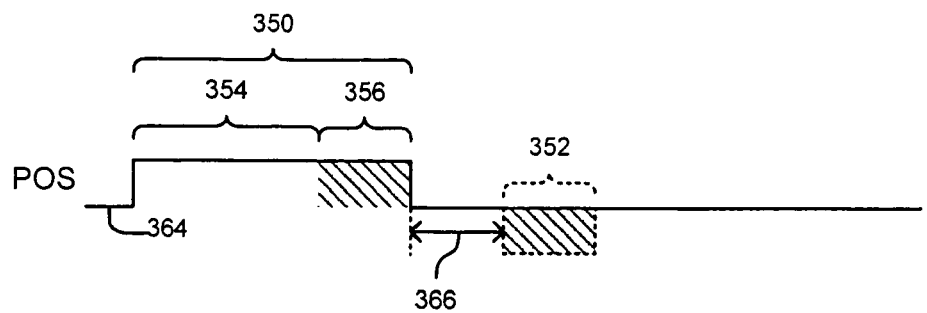
FIGS. 13A-13C are exemplary transitions of the signals generated by the pulse-width modulator of FIG. 9.

FIG. 13A shows an exemplary transition of output signal POS generated by pulse width modulator 306. The transition period 350 includes the added positive pulse width 356 followed by a counteracting negative pulse width 352 that is the same as the added positive pulse width 356. The counteracting minimum-width positive and negative pulses are added and subtracted by PWM module 306 to all signals POS, POS_DELAY, NEG and NEG_DELAY, although only that of signal POS is shown. The added minimum pulse width 356 ensures that switch pulse logic 130 and driver 132 have enough time to switch when clock signal CLK received by PWM module 306 operates at a relatively high frequency.

Figure 13B:
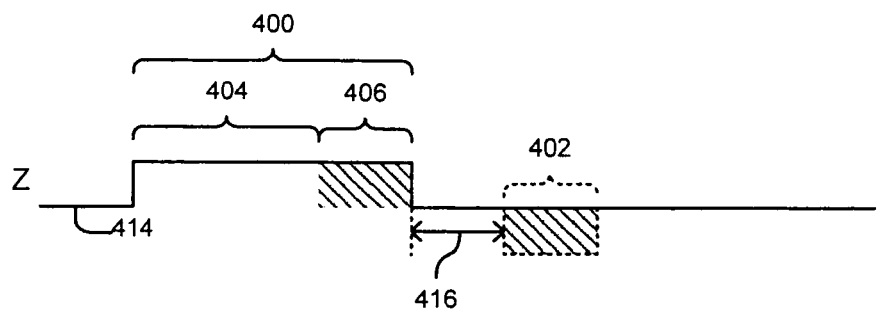

FIG. 13B shows an exemplary transition from 0 volt to VDDP at output node Z of signal source 102 (see FIG. 5). The transition period 400 includes the positive pulse width 400 followed by a counteracting negative pulse width 402 that is the same as the added positive pulse width 406. The counteracting minimum-width positive and negative pulses are added and subtracted by PWM module 306 to signals POS, POS_DELAY, NEG and NEG_DELAY, and are subsequently transferred to node Z. The added positive pulse width 406 ensures that switch pulse logic 130 and driver 132 have enough time to switch completely when clock signal CLK received by PWM module 306 operates at a relatively high frequency.

Figure 13C:
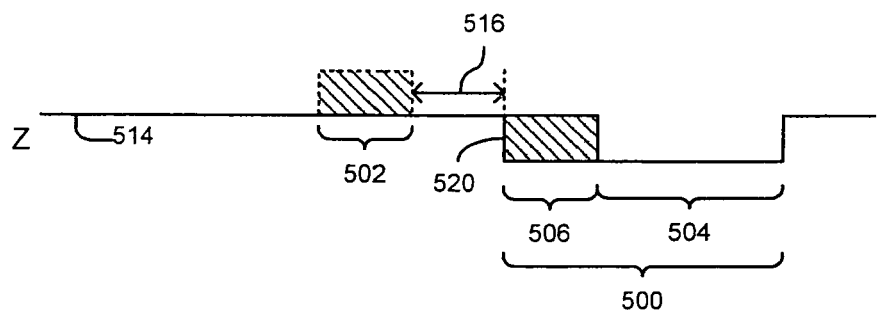

FIG. 13C shows an exemplary transition from 0 volt to VDDN at output node Z of signal source 102. Knowing in advance that a negative minimum pulse width 506 will be added, a counteracting positive minimum pulse width is added during the period 502. As described above, the added minimum pulse width 506 ensures that switch pulse logic 130 and driver 132 have enough time to switch completely when clock signal CLK received by PWM module 306 operates at a relatively high frequency.

Figure 14A:
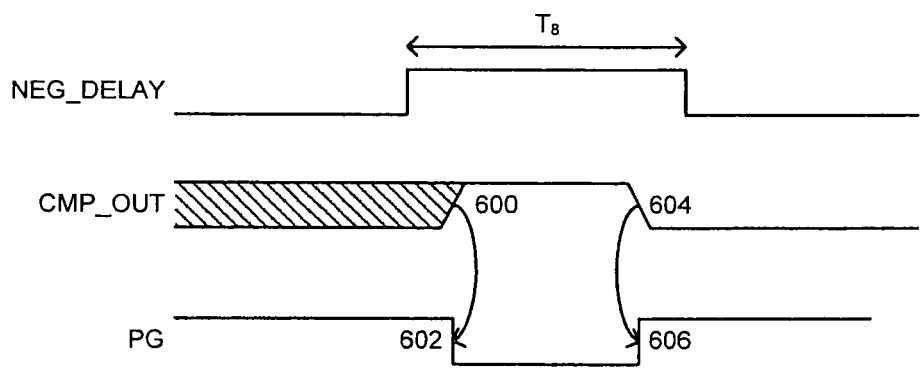
FIGS. 14A-14B are exemplary timing diagrams of a number of signals associated with the switch pulse logic of the amplifier of FIG. 5.
Figure 14B:
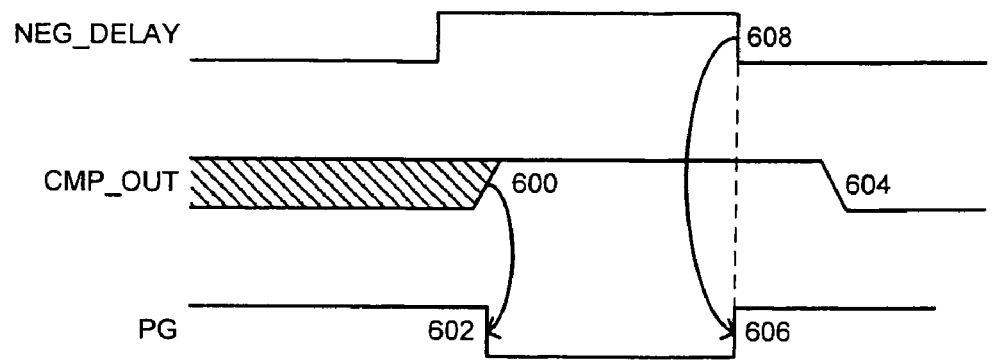

FIGS. 14A and 14B show exemplary timing relationship between signal NEG_DELAY, the output signal of comparator 128, CMP_OUT, and signal PG applied to the gate terminal of transistor 220 disposed in driver 132. During a predefined period $T_8$ while signal NEG_DELAY remains asserted, in response to a low-to-high transition 600 of signal CMP_OUT, signal PG is asserted, e.g., makes a high-to-low transition 602. Signal PG remains asserted until one of two conditions is satisfied. First, referring to FIG. 14A, signal PG is deasserted—shown using transition 606—if signal CMP_OUT makes a high-to-low transition 604 during the period $T_8$. When signal CMP_OUT makes such a high-to-low transition, a pulse generated within switch pulse logic 130 deasserts signal PG. Second, referring to FIG. 14B, if a high-to-low transition on signal CMP_OUT does not occur during period $T_8$, signal PG remains asserted until signal NEG_DELAY makes a high-to-low transition 608, in response to which signal PG is deasserted—shown using transition 606.

Figure 15A:
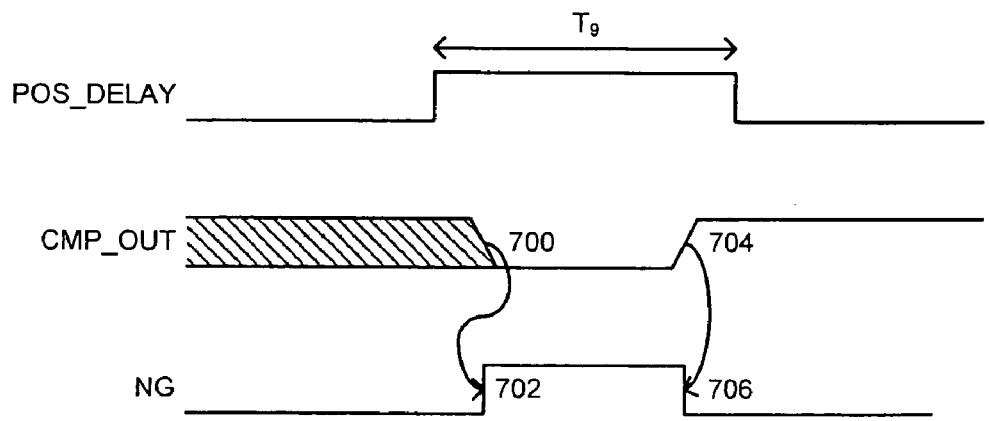
FIGS. 15A-15B are exemplary timing diagrams of a number of signals associated with the switch pulse logic of the amplifier of FIG. 5.
Figure 15B:
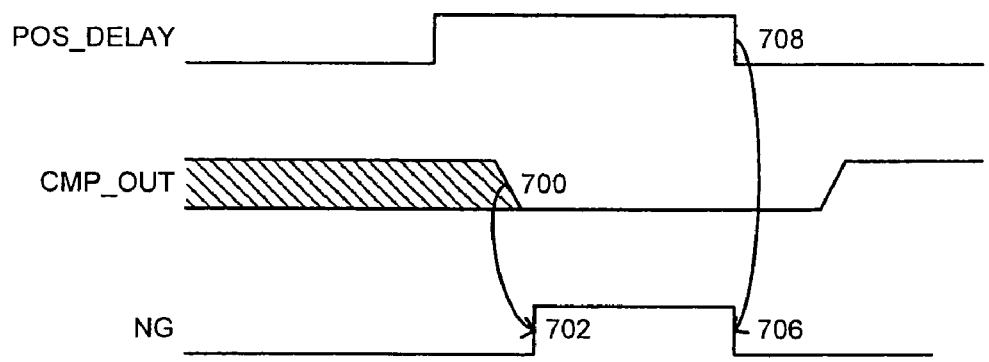

FIGS. 15A and 15B show exemplary timing relationship between signal NEG_DELAY, the output signal of comparator 128, CMP_OUT, and signal NG applied to the gate terminal of transistor 224 disposed in driver 132. During a predefined period $T_9$ while signal NEG_DELAY remains asserted, in response to a high-to-low transition 700 of signal CMP_OUT, signal NG is asserted, e.g., makes a low-to-high transition 702. Signal NG remains asserted until one of two conditions is satisfied. First, referring to FIG. 14B, signal NG is deasserted—shown using transition 706—if signal CMP_OUT makes a high-to-low transition 704 during period $T_9$. When signal CMP_OUT makes such a low-to-high transition, a pulse generated within switch pulse logic 130 deasserts signal NG. Second, referring to FIG. 15B, if a low-to-high transition on signal CMP_OUT does not occur during period $T_9$, signal NG remains asserted until signal NEG_DELAY makes a high-to-low transition 708, in response to which signal NG is deasserted—shown using transition 706.

Figure 16:
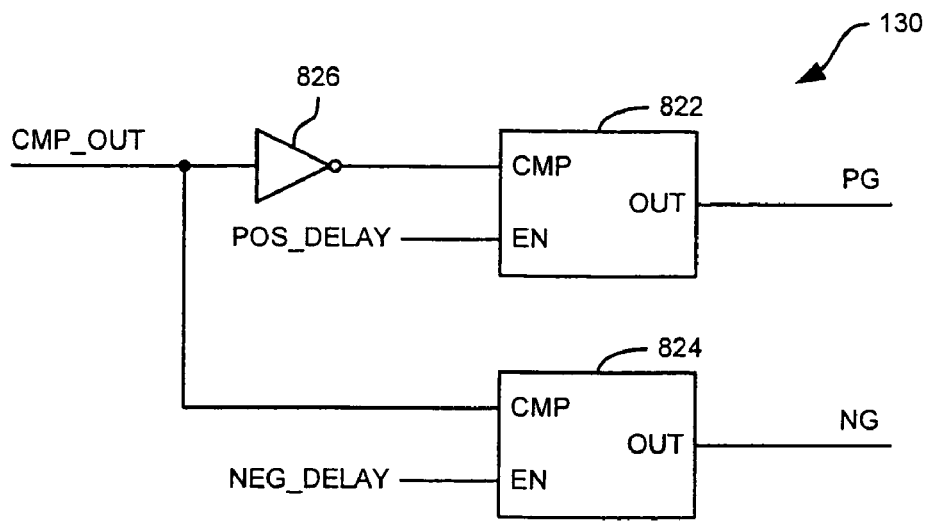
FIG. 16 is a logic block diagram of the switch pulse logic disposed in the amplifier of FIG. 5, in accordance with one embodiment.

FIG. 16 is a block diagram of switch pulse logic 130. Switch pulse logic 130 is shown as including a pair of one-shot logic blocks 822, 824 and inverter 826. Signal CMP_OUT generated by comparator 128 is applied to the input terminal CMP of one-shot block 824. Inverter 826 applies the inverse of signal CMP_OUT to the input terminal CMP of one-shot block 822. Signals POS_DELAY and NEG_DELAY are applied to the input terminal EN of one-shot logic blocks 822 and 824 respectively. One-shot logic blocks 822 and 824 are adapted to suppress spikes that may appear on signal CMP_OUT. Furthermore, the pulse width of the signal CMP_OUT is increased by a minimum predefined value if it is detected by the one-shot logic blocks 822 and 824 to be shorter than a pre-established value.

Figure 17:
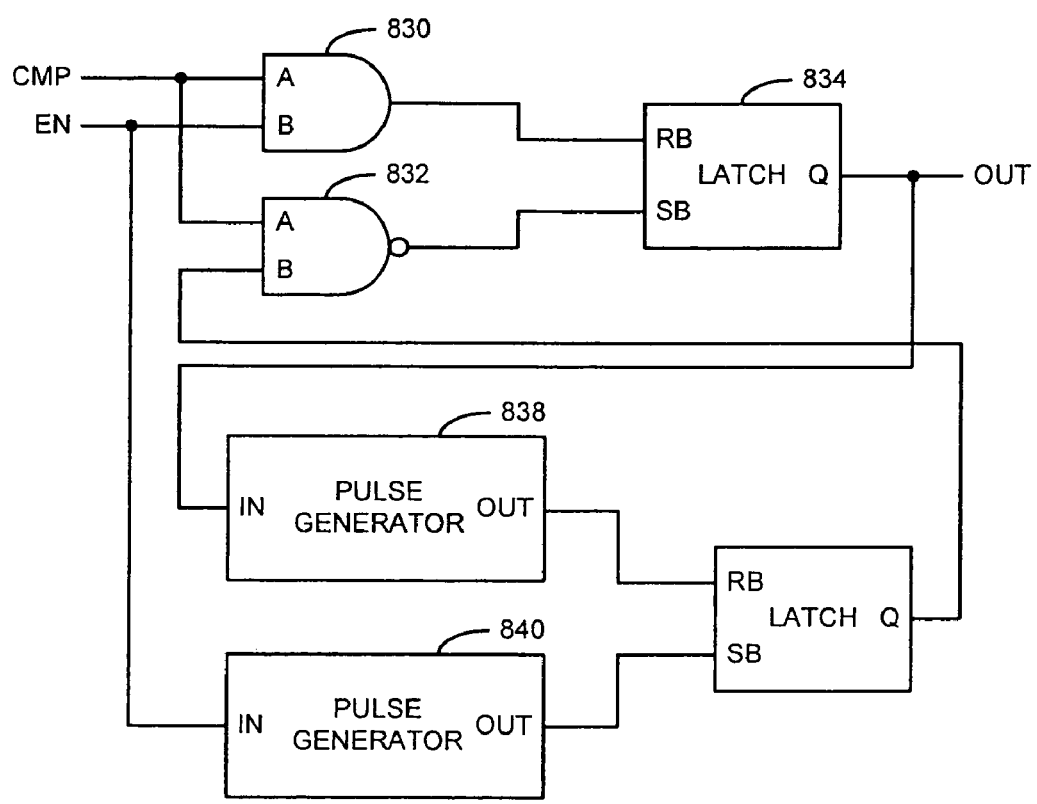
FIG. 17 shows a number of logic blocks disposed in the switch pulse logic of FIG. 16, in accordance with one embodiment.

FIG. 17 shows the various components of each of one-shot logic blocks 822 and 824, in accordance with one embodiment. Each of these one-shot logic blocks is shown as including an AND gate 830, a NAND gate 832, set-reset latches 834, 836, and pulse generators 838 and 840. Signal Q of each of latches 834 and 836 is set to 1 if the input signal SB of that latch is set to zero. Similarly, signal Q of each of latches 834 and 836 is set to zero if the input signal RB of that latch is set to zero. Each of pulse generators 838 and 840 generates a one-shot pulse of a predefined duration when it receives a transition on its input signal IN.

Referring again to FIG. 6, in signal generator 200 current sources 202 and 204 must be closely matched. Even a small mismatch in current sources 202 and 204 results in a significant performance reduction for amplifier 100 of FIG. 5. For example, to achieve a second harmonic performance in the range of 120 dB below signal, it is necessary to match current sources 202 and 204 within approximately 1 ppm. Achieving this accuracy is not practical even with modern technologies such as CMOS.

Figure 18:
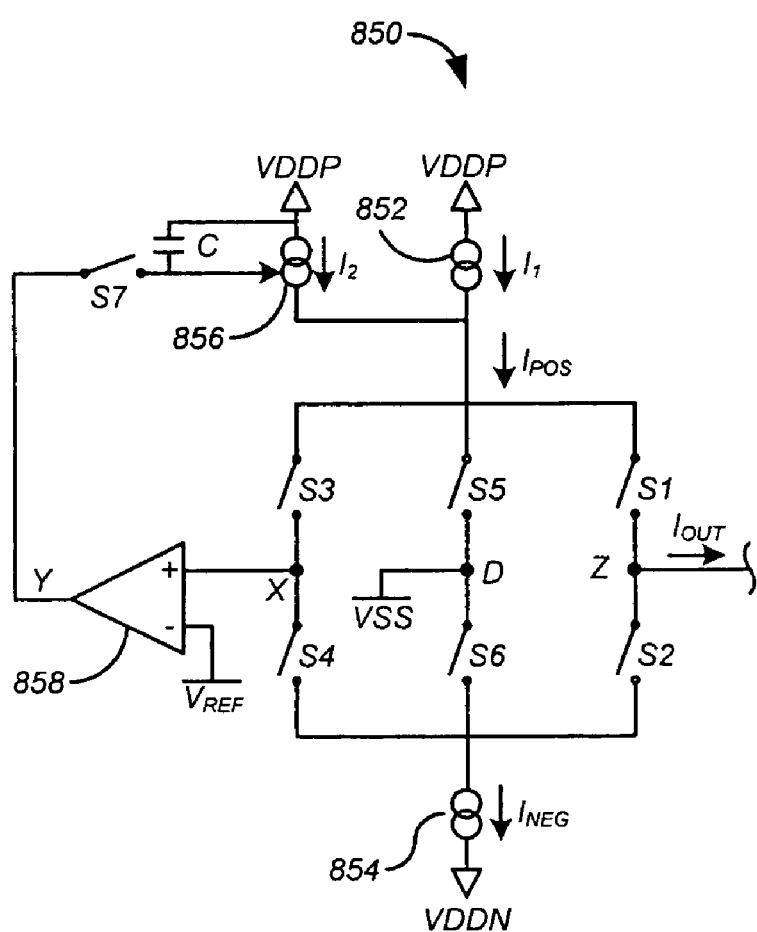
FIG. 18 is a block diagram of a signal generator according to one embodiment.

FIG. 18 is a block diagram of a signal generator 850 according to one embodiment. Referring again to FIG. 5, signal generator 850 can replace signal generator 102 to improve the efficiency of amplifier 100. When signal generator 102 is replaced by signal generator 850, resistor 120 is removed.

Referring again to FIG. 18, signal generator 850 includes two fixed current sources 852 and 854, an adjustable current source 856, a capacitor C, a comparator 858, and seven switches S1-S7. Current sources 852, 854, and 856 can be implemented as PMOS transistors, resistive degenerated current sources, and the like. In PMOS transistor implementations, a PMOS cascode transistor can be added to improve output impedance.

Comparator 858 can be implemented as a differential amplifier and the like. To reduce the impact of noise and/or offset, the differential amplifier can employ chopper stabilization or auto-zero techniques. Switches S1-S7 can be implemented as transistors, T-switches, and the like. Transistors used in signal generator 850 can be implemented in technologies such as CMOS, Bipolar, BICMOS, and the like.

Figure 19:
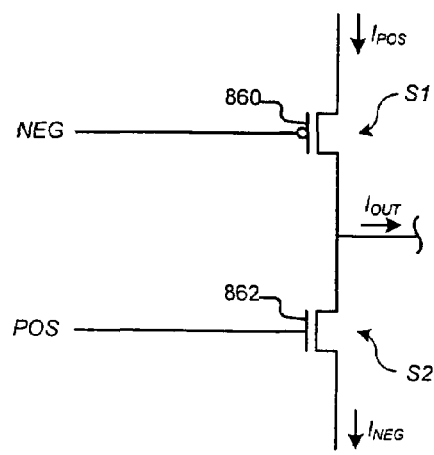
FIG. 19 shows a portion of the amplifier of FIG. 18 where switches S1 and S2 are implemented as transistors.
Figure 20:
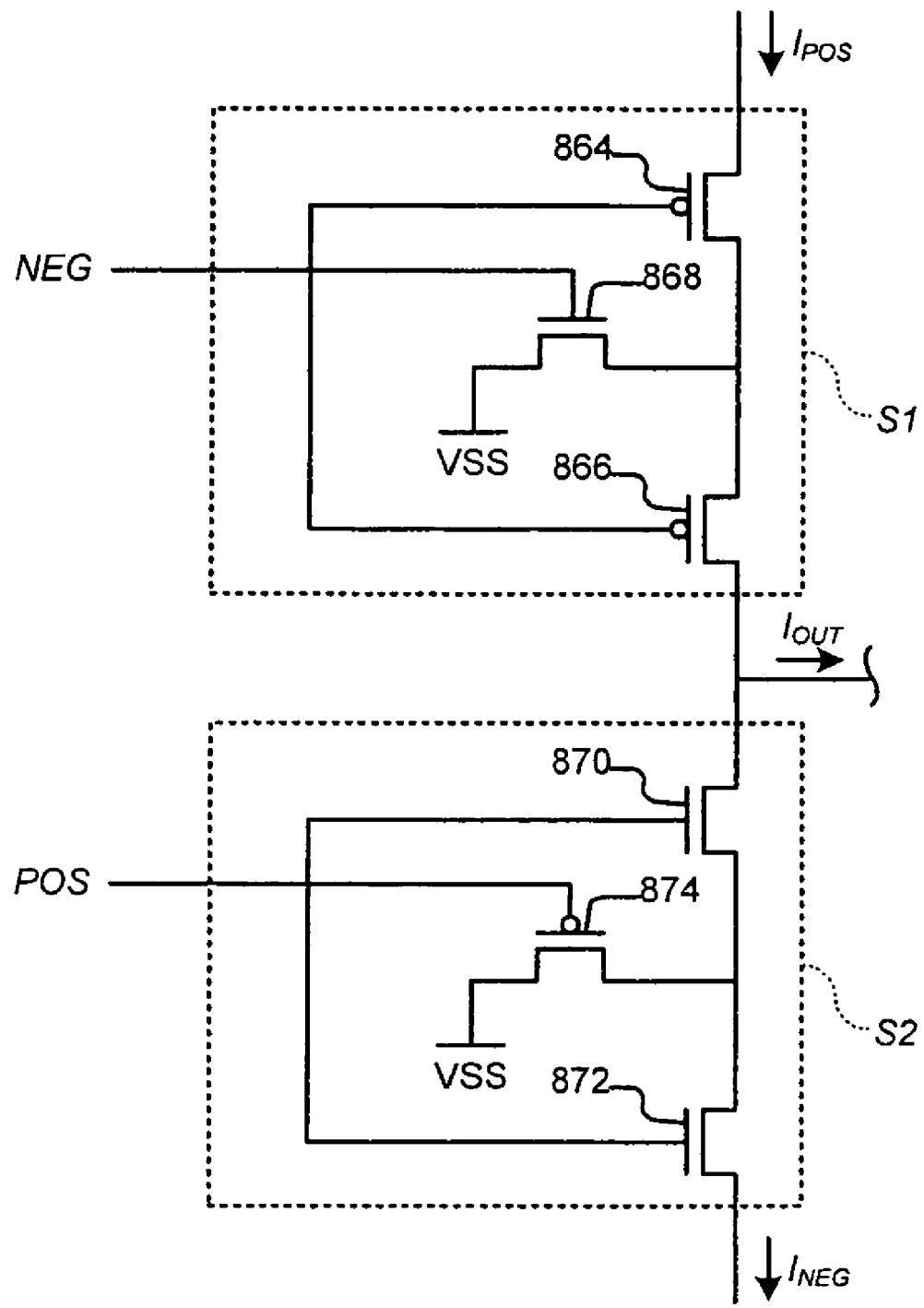
FIG. 20 shows a portion of the amplifier of FIG. 18 where switches S1 and S2 are implemented as T-switches.

FIG. 19 shows a portion of signal generator 850 of FIG. 18 where switches S1 and S2 are implemented as transistors. Referring to FIG. 19, switch S1 is implemented as a PMOS transistor 860 and switch S2 is implemented as an NMOS transistor 862. FIG. 20 shows a portion of signal generator 850 of FIG. 18 where switches S1 and S2 are implemented as T-switches. Referring to FIG. 20, switch S1 is implemented as two PMOS transistors 864, 866 and an NMOS transistor 868, while switch S2 is implemented as two NMOS transistors 870, 872 and a PMOS transistor 874. In both FIGS. 19 and 20, the input signals POS and NEG can be buffered, for example by inverter chains, to improve isolation. For even better isolation, the input to each transistor gate can be buffered separately.

Referring again to FIG. 18, fixed current source 852 is connected to a positive supply voltage VDDP, and generates a fixed current $I_1$. Adjustable current source 856 is also connected to supply voltage VDDP, and generates an adjustable current $I_2$. A switch S1 provides a current $I_{POS}=I_1+I_2$ to output node Z in accordance with control signal POS. Fixed current source 854 is connected to a negative supply voltage VDDN, and generates a fixed current $I_{NEG}$, which is provided to output node Z by a switch S2 in accordance with control signal NEG. Output node Z can drive various types of loads, for example including resistive loads, current integrators, active current-to-voltage converters with virtual grounds, and the like.

Figure 21:
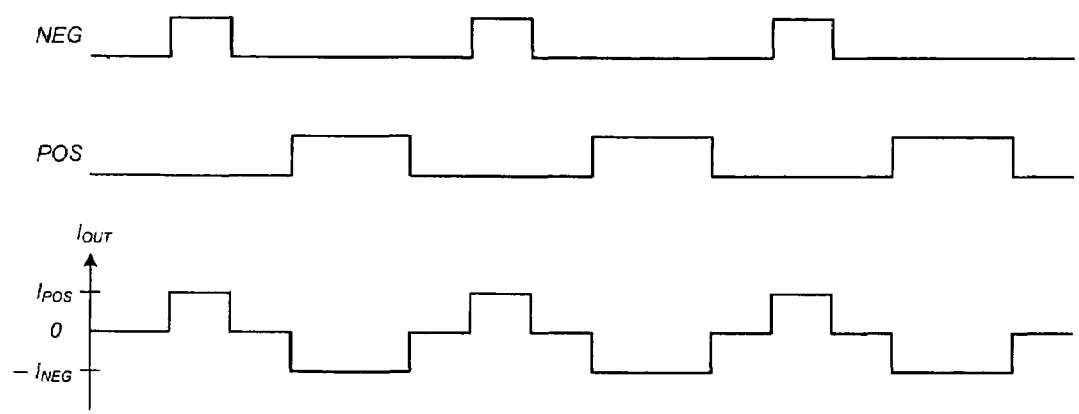
FIG. 21 is a timing diagram showing the relationship between the input signals NEG and POS and the output current IOUT in the amplification mode for the amplifier of FIG. 18.

Signal generator 850 can operate in two different modes: an amplification mode and a calibration mode In the amplification mode, switches S3, S4, and S7 remain open, while switches S1 and S2 operate according to input signals POS and NEG, thereby generating output current $I_{OUT}$. FIG. 21 is a timing diagram showing the relationship between the input signals NEG and POS and the output current $I_{OUT}$ in the amplification mode for signal generator 850 of FIG. 18. Input signals NEG and POS are active-high signals, but are not high simultaneously. When signal NEG is high, switch S1 is closed, thereby applying current $I_{POS}$ to node Z such that $I_{OUT}=I_{POS}$. When signal POS is high, switch S2 is closed, thereby applying current $I_{NEG}$ to node Z such that $I_{OUT}=-I_{NEG}$. When signals POS and NEG are both low, switches S1 and S2 are open, thereby applying no current to node Z such that $I_{OUT}=0$.

Referring again to FIG. 18, switches S5 and S6 are used to dump currents $I_{POS}$ and $I_{NEG}$ to a dummy node D in amplification mode. In the amplification mode, when switch S1 is opened, switch S5 is closed, thereby diverting current $I_{POS}$ to dummy node D. Similarly, when switch S2 is opened, switch S6 is closed, thereby diverting current $I_{NEG}$ to dummy node D. Dummy node D can be connected to supply voltage VSS.

When signal generator 850 is in calibration mode, switches S3 and S4 deliver currents $I_{POS}$ and $I_{NEG}$, respectively, to a calibration node X. In calibration mode, switches S3 and S4 are both closed, thereby creating a voltage at calibration node X that represents a difference between currents $I_{POS}$ and $I_{NEG}$. Comparator 858 compares the voltage at calibration node X with a reference voltage $V_{REF}$, and produces a calibration output at node Y based on the comparison. Switch S7 is closed in calibration mode, thereby connecting the calibration output of comparator 858 to an adjustment input of adjustable current source 856. This arrangement adjusts current $I_1$ to eliminate any difference between currents $I_{POS}$ and $I_{NEG}$. Capacitor C stores the voltage at the adjustment input after switch S7 is opened, so that the calibration achieved in calibration mode is maintained in amplification mode.

Although in the described embodiments, the elements of signal generator 850 are presented in one arrangement, other embodiments may feature other arrangements, as will be apparent based on the disclosure and teachings provided herein. In the example of FIG. 18, supply voltages VDDP and VDDN are respectively at +1.5 volts and −1.5 volts, while supply voltage VSS is at 0 volts. However, other voltages can be used for VDDP, VSS, and VDDS where VDDP>VSS>VDDS. In addition, adjustable current source 856 can be connected in parallel with current source 854 instead of in parallel with current source 852.

Figure 22:
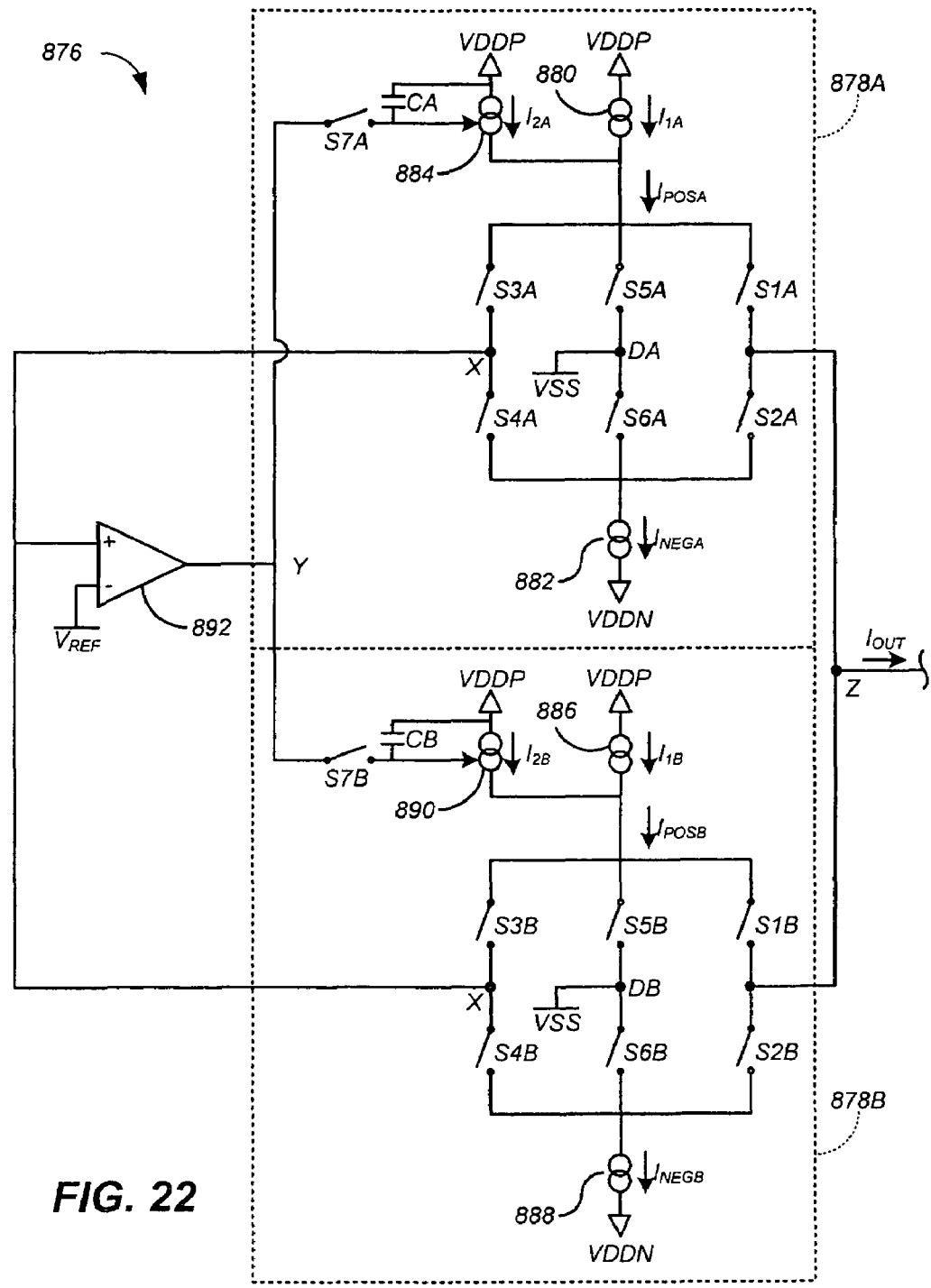
FIG. 22 is a block diagram of a dual-bridge signal generator according to one embodiment.

Of course, the single-bridge signal generator 850 of FIG. 18 must suspend amplification mode in order to calibrate current $I_2$. FIG. 22 is a block diagram of a dual-bridge signal generator 876 according to one embodiment. Referring again to FIG. 5, signal generator 876 can replace signal generator 102 to improve the efficiency of amplifier 100. When signal generator 102 is replaced by signal generator 876, resistor 120 is removed.

Signal generator 876 includes two bridges 878A,B. Each bridge 878 can operate in either amplification mode or calibration mode. While one bridge 878 operates in amplification mode, the other bridge 878 operates in calibration mode. Bridges 878 change modes in unison so that the current output $I_{OUT}$ of signal generator 876 is uninterrupted.

Bridge 878A includes two fixed current sources 880 and 882, an adjustable current source 884, a capacitor CA, and seven switches S1A-S7A. Bridge 878B includes two fixed current sources 886 and 888, an adjustable current source 890, a capacitor CB, and seven switches S1B-S7B. Current sources 880, 882, 884, 886, 888, and 890 can be implemented as described above for signal generator 850 of FIG. 18.

Bridges 878 are connected together at output node Z and calibration node X, and share a comparator 892. The comparator output of comparator 892 is connected to both bridges 878, at switches 7A and 7B. Comparator 892, and switches S1A-S7A and S1B-S7B, can be implemented as described above for signal generator 850 of FIG. 18. For example, comparator 892 can include first and second differential amplifiers. The first differential amplifier adjusts adjustable current $I_{2A}$ and the second differential amplifier operates in auto-zero mode when bridge 878A is in calibration mode. The second differential amplifier adjusts adjustable current $I_{2B}$ and the first differential amplifier operates in auto-zero mode when bridge 878B is in calibration mode.

Figure 23:
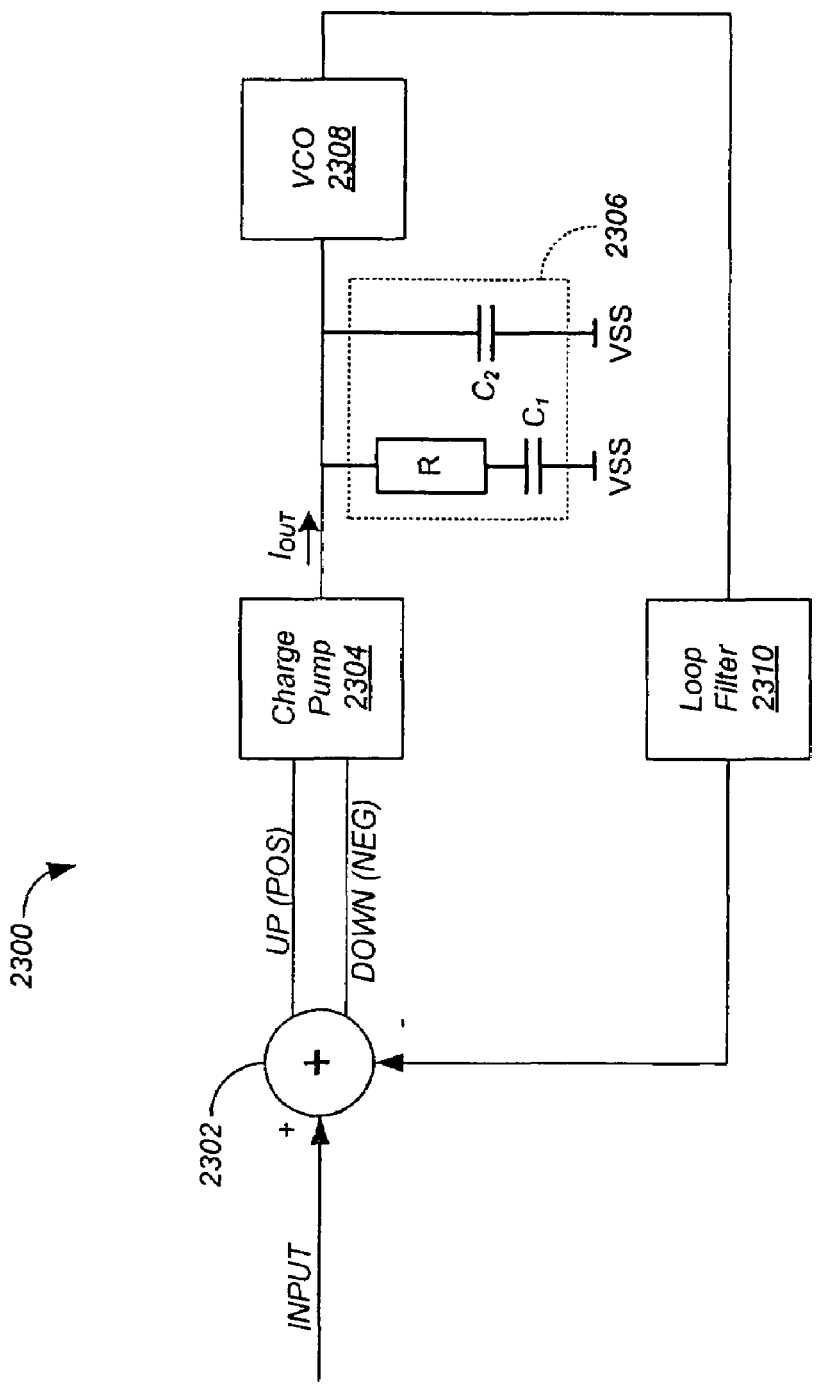
FIG. 23 shows a fractional-N sigma-delta phase-locked loop (PLL) according to one embodiment.

The signal generators disclosed herein have many uses other than those described above. For example, the signal generators can be employed as charge pumps in fractional-N sigma-delta phase-locked loops. FIG. 23 shows a fractional-N sigma-delta phase-locked loop (PLL) 2300 according to one embodiment. PLL 2300 includes a phase detector 2302, a charge pump 2304, a load 2306, a voltage-controlled oscillator (VCO) 2308, and a loop filter 2310.

Referring to FIG. 23, charge pump 2304 produces an output current $I_{OUT}$ in accordance with control signals UP and DOWN. Charge pump 2304 can be implemented as one of the signal generators disclosed herein. For example, charge pump 2304 can be implemented as signal generator 850 of FIG. 18 or signal generator 876 of FIG. 22. In these implementations, the UP and DOWN signals of FIG. 23 drive the signal generators in the same way as the POS and NEG signals, respectively, described above.

Referring again to FIG. 23, current $I_{OUT}$ is applied to load 2306 and VCO 2308. Load 2306 can be implemented, for example, as resistor R and capacitors $C_1$ and $C_2$, as shown in FIG. 23. Loop filter 2310 receives the output of VCO 2308, and provides an output as the negative input of phase detector 2302. Phase detector 2302 receives an input signal INPUT as the positive input, and generates signals UP and DOWN based on the positive and negative inputs.

In conventional fractional-N sigma-delta PLLs, any noise that has been shaped out of band can be aliased back to the low-frequency band if the currents produced by the charge pump do not match closely. Because the signal generators disclosed herein produce closely-matching output currents, they can improve the performance of these PLLs significantly.

Figure 24A:
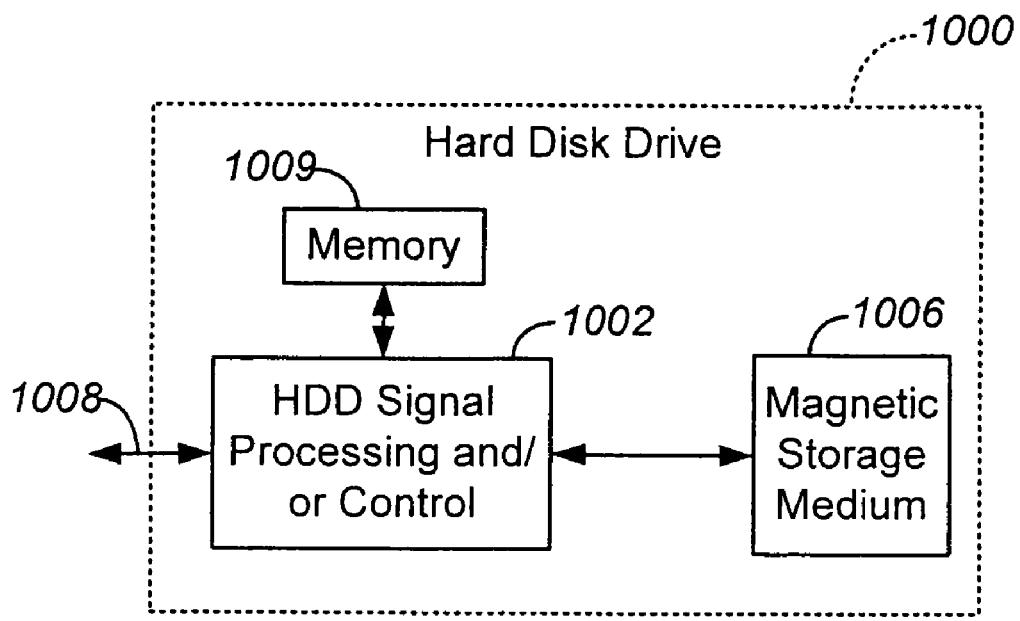
FIGS. 24A-24H show various embodiments.

Referring now to FIGS. 24A-24H, various exemplary implementations are shown. Referring to FIG. 24A, some embodiments include a hard disk drive 1000. Embodiments may implement either or both signal processing and/or control circuits, which are generally identified in FIG. 24A at 1002. In some implementations, signal processing and/or control circuit 1002 and/or other circuits (not shown) in HDD 1000 may process data, perform coding and/or encryption, perform calculations, and/or format data that is output to and/or received from a magnetic storage medium 1006.

HDD 1000 may communicate with a host device (not shown) such as a computer, mobile computing devices such as personal digital assistants, cellular phones, media or MP3 players and the like, and/or other devices via one or more wired or wireless communication links 1008. HDD 1000 may be connected to memory 1009, such as random access memory (RAM), a low latency nonvolatile memory such as flash memory, read only memory (ROM) and/or other suitable electronic data storage.

Figure 24B:
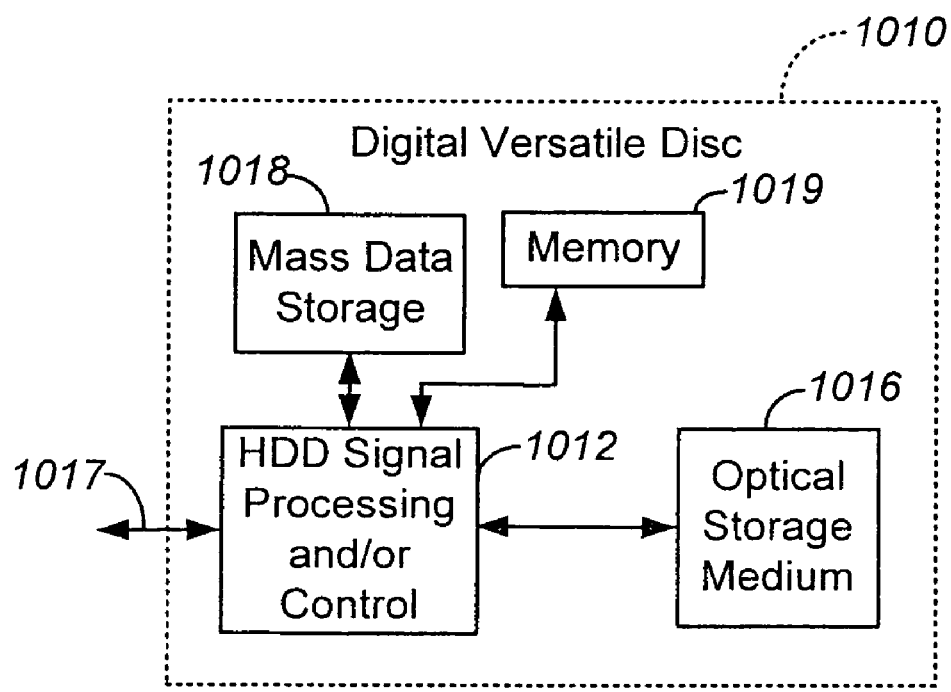

Referring now to FIG. 24B, some embodiments include a digital versatile disc (DVD) drive 1010. Embodiments may implement either or both signal processing and/or control circuits, which are generally identified in FIG. 24B at 1012, and/or mass data storage 1018 of DVD drive 1010. Signal processing and/or control circuit 1012 and/or other circuits (not shown) in DVD 1010 may process data, perform coding and/or encryption, perform calculations, and/or format data that is read from and/or data written to an optical storage medium 1016. In some implementations, signal processing and/or control circuit 1012 and/or other circuits (not shown) in DVD 1010 can also perform other functions such as encoding and/or decoding and/or any other signal processing functions associated with a DVD drive.

DVD drive 1010 may communicate with an output device (not shown) such as a computer, television or other device via one or more wired or wireless communication links 1017. DVD 1010 may communicate with mass data storage 1018 that stores data in a nonvolatile manner. Mass data storage 1018 may include a hard disk drive (HDD) such as that shown in FIG. 24A. The HDD may be a mini HDD that includes one or more platters having a diameter that is smaller than approximately 1.8". DVD 1010 may be connected to memory 1019, such as RAM, ROM, low latency nonvolatile memory such as flash memory, and/or other suitable electronic data storage.

Figure 24C:
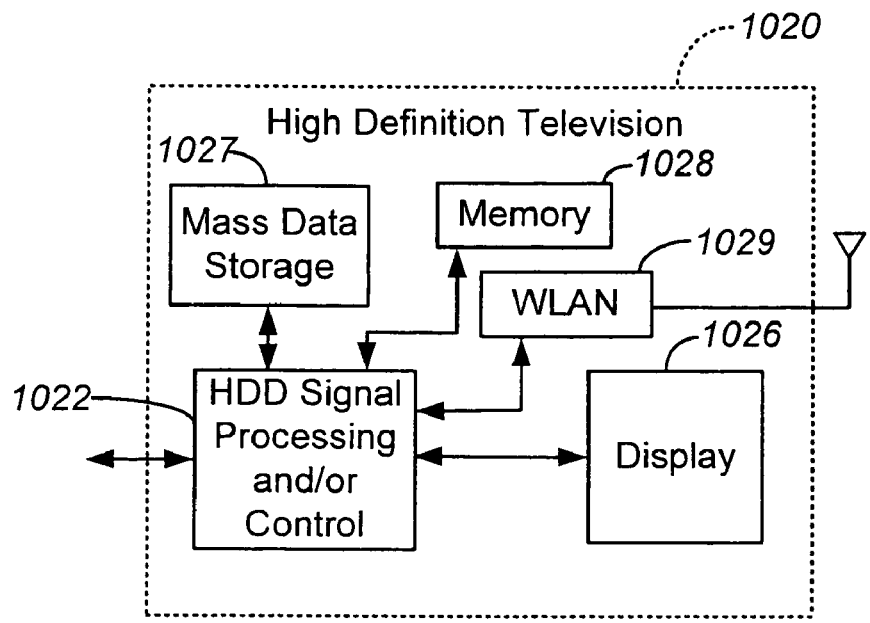

Referring now to FIG. 24C, some embodiments include a high definition television (HDTV) 1020. Embodiments may implement either or both signal processing and/or control circuits, which are generally identified in FIG. 24C at 1022, a WLAN interface and/or mass data storage of the HDTV 1020. HDTV 1020 receives HDTV input signals in either a wired or wireless format and generates HDTV output signals for a display 1026. In some implementations, signal processing circuit and/or control circuit 1022 and/or other circuits (not shown) of HDTV 1020 may process data, perform coding and/or encryption, perform calculations, format data and/or perform any other type of HDTV processing that may be required.

HDTV 1020 may communicate with mass data storage 1027 that stores data in a nonvolatile manner such as optical and/or magnetic storage devices. At least one HDD may have the configuration shown in FIG. 24A and/or at least one DVD may have the configuration shown in FIG. 24B. The HDD may be a mini HDD that includes one or more platters having a diameter that is smaller than approximately 1.8". HDTV 1020 may be connected to memory 1028 such as RAM, ROM, low latency nonvolatile memory such as flash memory and/or other suitable electronic data storage. HDTV 1020 also may support connections with a WLAN via a WLAN network interface 1029.

Figure 24D:
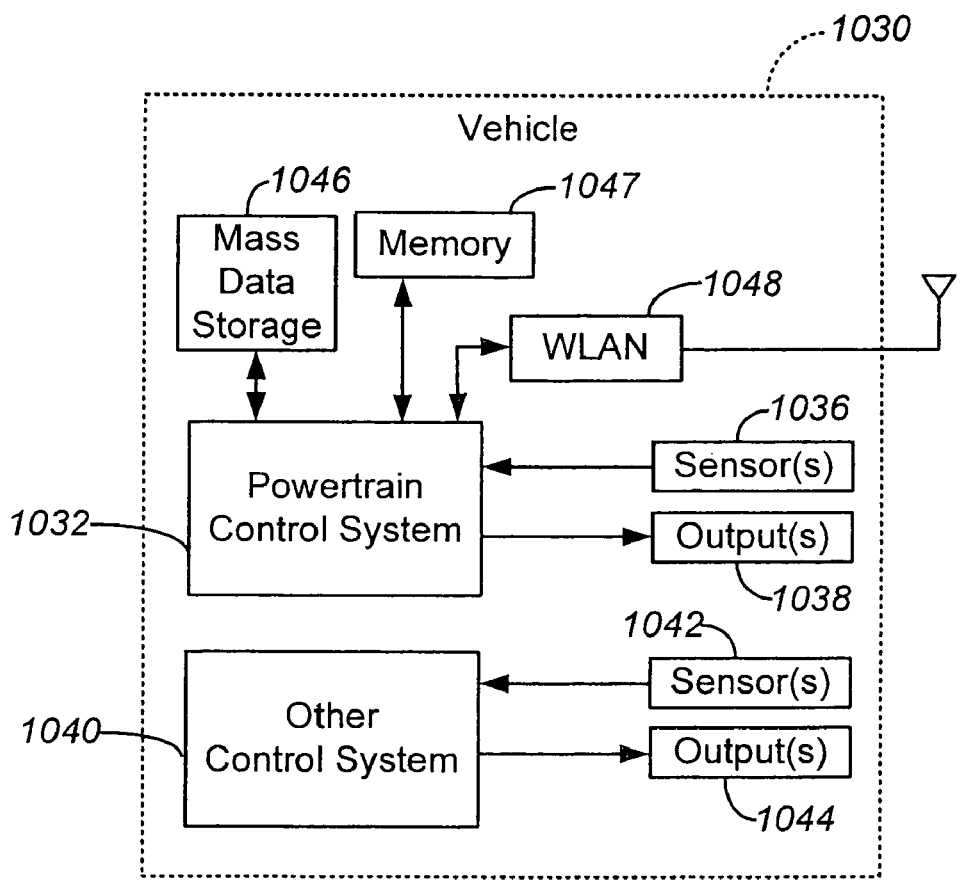

Referring now to FIG. 24D, some embodiments include a control system of a vehicle 1030, a WLAN interface and/or mass data storage of the vehicle control system. In some implementations, embodiments implement a powertrain control system 1032 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

Some embodiments can include other control systems 1040 of vehicle 1030. Control system 1040 may likewise receive signals from input sensors 1042 and/or output control signals to one or more output devices 1044. In some implementations, control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 1032 may communicate with mass data storage 1046 that stores data in a nonvolatile manner. Mass data storage 1046 may include optical and/or magnetic storage devices for example hard disk drives HDD and/or DVDs. At least one HDD may have the configuration shown in FIG. 24A and/or at least one DVD may have the configuration shown in FIG. 24B. The HDD may be a mini HDD that includes one or more platters having a diameter that is smaller than approximately 1.8". Powertrain control system 1032 may be connected to memory 1047 such as RAM, ROM, low latency nonvolatile memory such as flash memory and/or other suitable electronic data storage. Powertrain control system 1032 also may support connections with a WLAN via a WLAN network interface 1048. The control system 1040 may also include mass data storage, memory and/or a WLAN interface (all not shown).

Figure 24E:
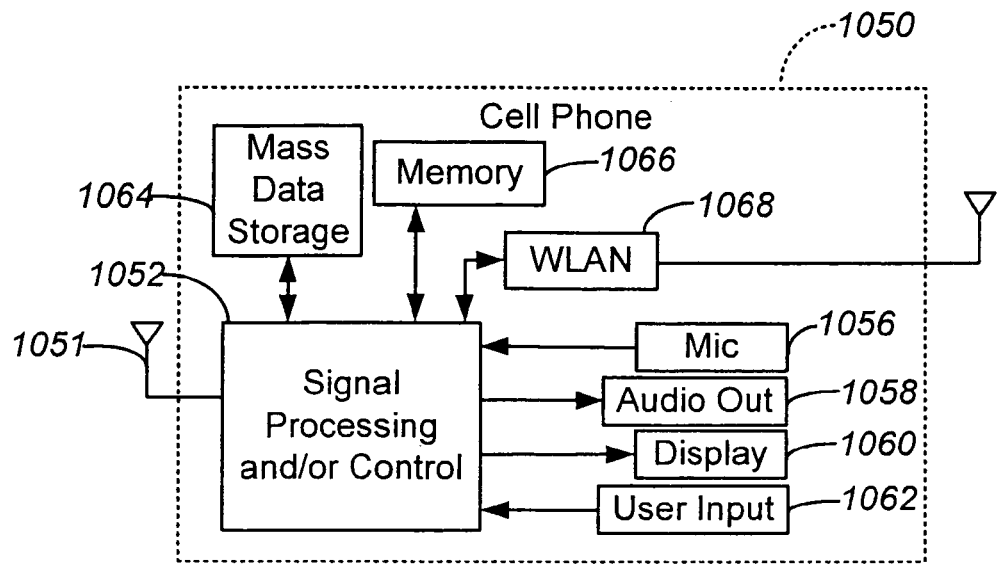

Referring now to FIG. 24E, some embodiments include a cellular phone 1050 that may include a cellular antenna 1051. Some embodiments may implement either or both signal processing and/or control circuits, which are generally identified in FIG. 24E at 1052, a WLAN interface and/or mass data storage of the cellular phone 1050. In some implementations, cellular phone 1050 includes a microphone 1056, an audio output 1058 such as a speaker and/or audio output jack, a display 1060 and/or an input device 1062 such as a keypad, pointing device, voice actuation and/or other input device. Signal processing and/or control circuits 1052 and/or other circuits (not shown) in cellular phone 1050 may process data, perform coding and/or encryption, perform calculations, format data and/or perform other cellular phone functions.

Cellular phone 1050 may communicate with mass data storage 1064 that stores data in a nonvolatile manner such as optical and/or magnetic storage devices for example hard disk drives HDD and/or DVDs. At least one HDD may have the configuration shown in FIG. 24A and/or at least one DVD may have the configuration shown in FIG. 24B. The HDD may be a mini HDD that includes one or more platters having a diameter that is smaller than approximately 1.8". Cellular phone 1050 may be connected to memory 1066 such as RAM, ROM, low latency nonvolatile memory such as flash memory and/or other suitable electronic data storage. Cellular phone 1050 also may support connections with a WLAN via a WLAN network interface 1068.

Figure 24F:
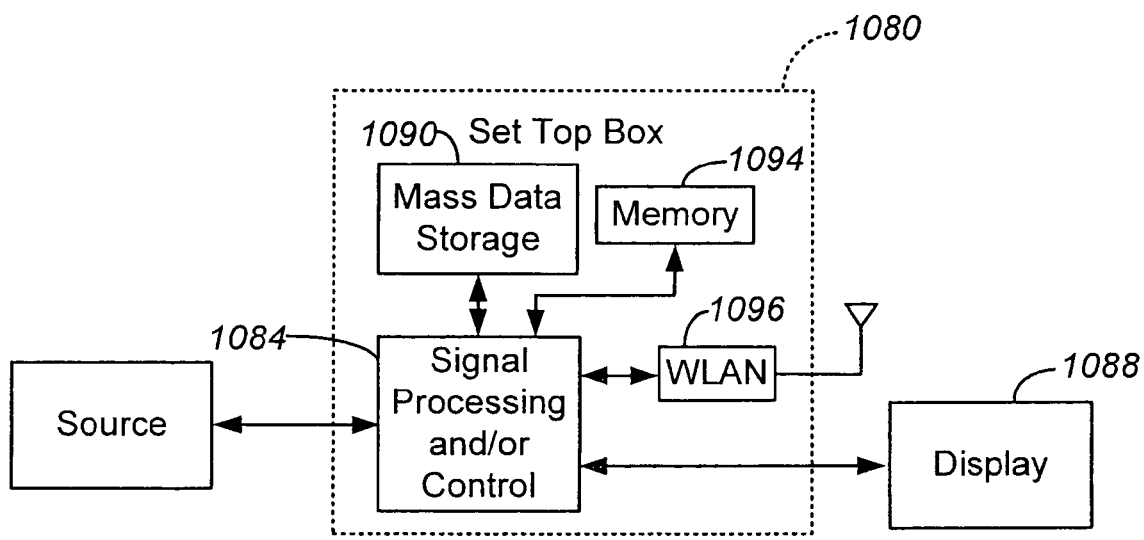

Referring now to FIG. 24F, some embodiments include a set top box 1080. Some embodiments may implement either or both signal processing and/or control circuits, which are generally identified in FIG. 24F at 1084, a WLAN interface and/or mass data storage of the set top box 1080. Set top box 1080 receives signals from a source such as a broadband source and outputs standard and/or high definition audio/video signals suitable for a display 1088 such as a television and/or monitor and/or other video and/or audio output devices. Signal processing and/or control circuits 1084 and/or other circuits (not shown) of the set top box 1080 may process data, perform coding and/or encryption, perform calculations, format data and/or perform any other set top box function.

Set top box 480 may communicate with mass data storage 1090 that stores data in a nonvolatile manner. Mass data storage 1090 may include optical and/or magnetic storage devices for example hard disk drives HDD and/or DVDs. At least one HDD may have the configuration shown in FIG. 24A and/or at least one DVD may have the configuration shown in FIG. 24B. The HDD may be a mini HDD that includes one or more platters having a diameter that is smaller than approximately 1.8". Set top box 1080 may be connected to memory 1094 such as RAM, ROM, low latency nonvolatile memory such as flash memory and/or other suitable electronic data storage. Set top box 1080 also may support connections with a WLAN via a WLAN network interface 1096.

Figure 24G:
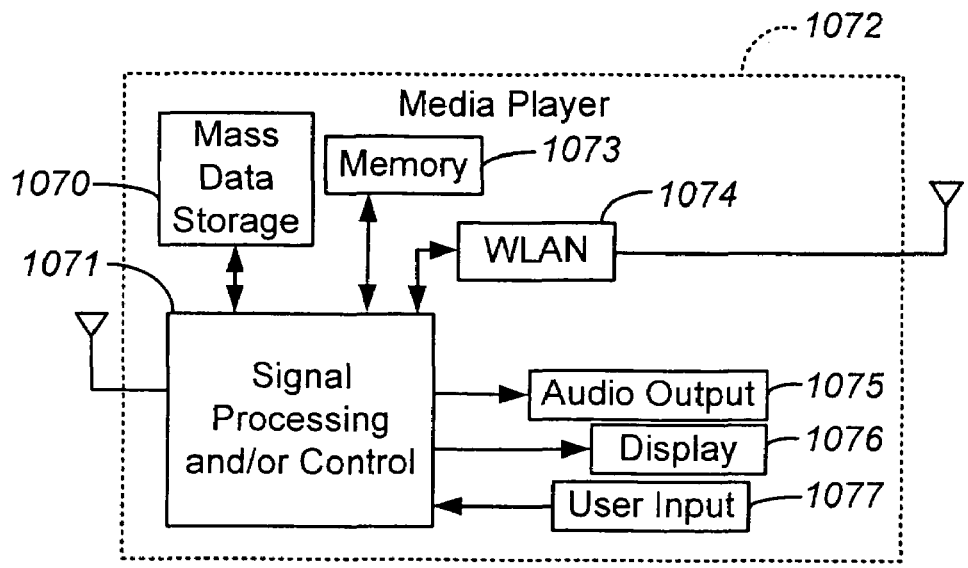

Referring now to FIG. 24G, some embodiments include a media player 1072. Some embodiments may implement either or both signal processing and/or control circuits, which are generally identified in FIG. 24G at 1071, a WLAN interface and/or mass data storage of the media player 1072. In some implementations, media player 1072 includes a display 1076 and/or a user input 1077 such as a keypad, touchpad and the like. In some implementations, media player 1072 may employ a graphical user interface (GUI) that typically employs menus, drop down menus, icons and/or a point-and-click interface via display 1076 and/or user input 1077. Media player 1072 further includes an audio output 1075 such as a speaker and/or audio output jack. Signal processing and/or control circuits 1071 and/or other circuits (not shown) of media player 1072 may process data, perform coding and/or encryption, perform calculations, format data and/or perform any other media player function.

Media player 1072 may communicate with mass data storage 1070 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 24A and/or at least one DVD may have the configuration shown in FIG. 24B. The HDD may be a mini HDD that includes one or more platters having a diameter that is smaller than approximately 1.8". Media player 1072 may be connected to memory 1073 such as RAM, ROM, low latency nonvolatile memory such as flash memory and/or other suitable electronic data storage. Media player 1072 also may support connections with a WLAN via a WLAN network interface 1074.

Figure 24H:
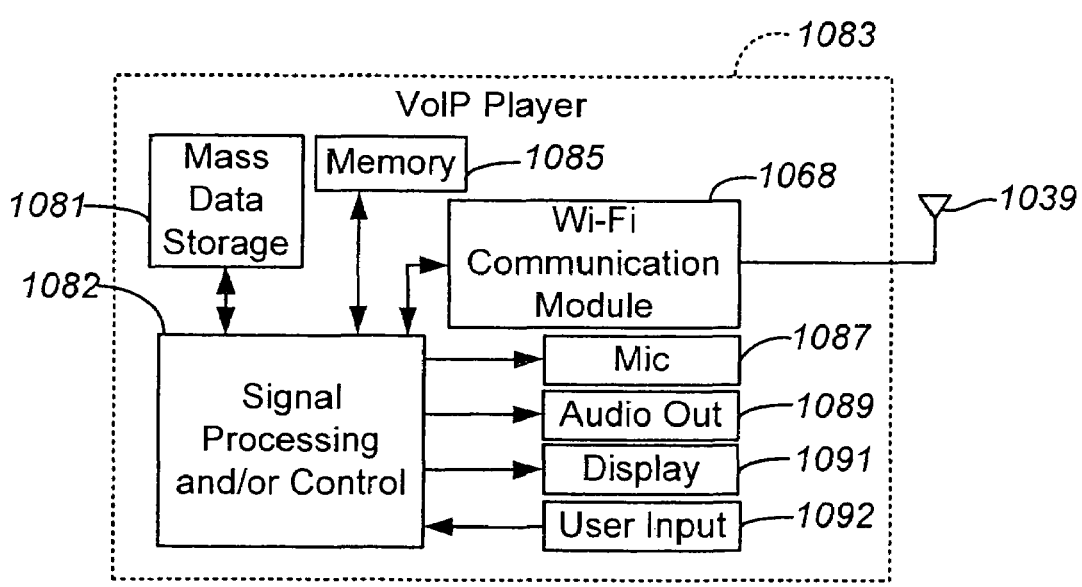

Referring to FIG. 24H, some embodiments include a Voice over Internet Protocol (VoIP) phone 1083 that may include an antenna 1039. Some embodiments may implement either or both signal processing and/or control circuits, which are generally identified in FIG. 24H at 1082, a wireless interface and/or mass data storage of the VoIP phone 1083. In some implementations, VoIP phone 1083 includes, in part, a microphone 1087, an audio output 1089 such as a speaker and/or audio output jack, a display monitor 1091, an input device 1092 such as a keypad, pointing device, voice actuation and/or other input devices, and a Wireless Fidelity (Wi-Fi) communication module 1086. Signal processing and/or control circuits 1082 and/or other circuits (not shown) in VoIP phone 1083 may process data, perform coding and/or encryption, perform calculations, format data and/or perform other VoIP phone functions.

VoIP phone 1083 may communicate with mass data storage 502 that stores data in a nonvolatile manner such as optical and/or magnetic storage devices, for example hard disk drives HDD and/or DVDs. At least one HDD may have the configuration shown in FIG. 24A and/or at least one DVD may have the configuration shown in FIG. 24B. The HDD may be a mini HDD that includes one or more platters having a diameter that is smaller than approximately 1.8". VoIP phone 1083 may be connected to memory 1085, which may be a RAM, ROM, low latency nonvolatile memory such as flash memory and/or other suitable electronic data storage. VoIP phone 1083 is configured to establish communications link with a VoIP network (not shown) via Wi-Fi communication module 1086. Still other implementations in addition to those described above are contemplated. Although not explicitly shown, some embodiments may also be disposed in various other portable electronic devices, such as MP3 players, personal digital assistants (PDA), notebook computers, etc.

Embodiments can be implemented in digital electronic circuitry, or in computer hardware, firmware, software, or in combinations of them. Apparatus can be implemented in a computer program product tangibly embodied in a machine-readable storage device for execution by a programmable processor; and method steps can be performed by a programmable processor executing a program of instructions to perform functions by operating on input data and generating output. Some embodiments can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors. Generally, a processor will receive instructions and data from a read-only memory and/or a random access memory. Generally, a computer will include one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing can be supplemented by, or incorporated in, ASICs (application-specific integrated circuits).

A number of implementations have been described. Nevertheless, it will be understood that various modifications may be made without departing from the spirit and scope of the invention. Accordingly, other implementations are within the scope of the following claims.

What is claimed is:

1. An apparatus comprising:
   a first fixed current source to produce a first fixed current;
   a second fixed current source to produce a second fixed current;
   a first adjustable current source to produce a first adjustable current;
   a first switch to deliver the first fixed current and the first adjustable current to a first output node when the first switch is closed;
   a second switch to deliver the second fixed current to the first output node when the second switch is closed; and
   an adjustment circuit to adjust the first adjustable current according to the first fixed current, the second fixed current, and the first adjustable current.

2. The apparatus of claim 1, further comprising:
   a third switch to deliver the first fixed current and the first adjustable current to a calibration node when the third switch is closed; and
   a fourth switch to deliver the second fixed current to the calibration node when the fourth switch is closed;
   wherein the adjustment circuit adjusts the first adjustable current according to a voltage at the calibration node when the third and fourth switches are closed.

3. The apparatus of claim 1, wherein the adjustment circuit comprises:
   a comparator to produce a calibration voltage at a comparator output, the calibration voltage based on a reference voltage and a voltage at the calibration node when the third and fourth switches are closed; and
   a fifth switch to couple the comparator output and a control input of the first adjustable current source when the fifth switch is closed, wherein the first adjustable current source adjusts the first adjustable current in accordance with the control input.

4. The apparatus of claim 3:
   wherein when the apparatus is in an amplification mode, the first and second switches operate according to respective first and second input signals, and the third, fourth, and fifth switches are open; and
   wherein when the apparatus is in a calibration mode, the third, fourth, and fifth switches are closed, and the first and second switches are open.

5. The apparatus of claim 4, further comprising:
   a sixth switch to deliver the first fixed current and the first adjustable current to a dummy node when the sixth switch is closed; and
   a seventh switch to deliver the second fixed current to the dummy node when the seventh switch is closed;
   wherein when the apparatus is in the amplification mode, the sixth switch is open when the first switch is closed and closed when the first switch is open, and the seventh switch is open when the second switch is closed and closed when the second switch is open.

6. The apparatus of claim 1, wherein at least one of the current sources comprises at least one of:
   a resistive degenerated current source; and
   a cascode transistor.

7. The apparatus of claim 1, wherein at least one of the switches comprises at least one of:
   a T-switch; and
   a T-switch, wherein each gate of the T-switch is driven by independent inverter chains.

8. The apparatus of claim 1, wherein the adjustment circuit comprises:
   a chopper-stabilized differential amplifier.

9. The apparatus of claim 1, further comprising:
   a first bridge comprising
      the first fixed current source,
      the second fixed current source,
      the first adjustable current source,
      the first switch, and
      the second switch; and
   a second bridge comprising
      a third current source to produce a third current,
      a fourth current source to produce a fourth current,
      a second adjustable current source to produce a second adjustable current,
      a third switch to deliver the third current and the second adjustable current to the first output node when the third switch is closed, and
      a fourth switch to deliver the fourth current to the first output node when the fourth switch is closed;
   wherein the first bridge is in an amplification mode when the second bridge is in a calibration mode, and the second bridge is in the amplification mode when the first bridge is in the calibration mode;
   wherein the adjustment circuit adjusts the first adjustable current when the first bridge is in the calibration mode; and
   wherein the adjustment circuit adjusts the second adjustable current according to the third current, the fourth current, and the second adjustable current when the second bridge is in the calibration mode.

10. The apparatus of claim 9, further comprising:
    a fifth switch to deliver the first fixed current and the first adjustable current to a calibration node when the fifth switch is closed; and
    a sixth switch to deliver the second fixed current to the calibration node when the sixth switch is closed;
    a seventh switch to deliver the third current and the second adjustable current to the calibration node when the seventh switch is closed; and
    an eighth switch to deliver the fourth current to the calibration node when the eighth switch is closed;
    wherein the fifth and sixth switches are closed and the seventh and eighth switches are open when the first bridge is in the calibration mode and the second bridge is in the amplification mode; and
    wherein the fifth and sixth switches are open and the seventh and eighth switches are closed when the first bridge is in the amplification mode and the second bridge is in the calibration mode.

11. The apparatus of claim 10, wherein the adjustment circuit comprises:
    a comparator to produce a calibration voltage at a comparator output, the calibration voltage based on a reference voltage and a voltage at the calibration node;
    a ninth switch to couple the comparator output and a control input of the first adjustable current source when the ninth switch is closed, wherein the first adjustable current source adjusts the first adjustable current in accordance with the control input of the first adjustable current source; and
    a tenth switch to couple the comparator output and a control input of the second adjustable current source when the tenth switch is closed, wherein the second adjustable current source adjusts the second adjustable current in accordance with the control input of the second adjustable current source.

12. The apparatus of claim 11, further comprising:
    an eleventh switch to deliver the first fixed current and the first adjustable current to a first dummy node when the eleventh switch is closed;

a twelfth switch to deliver the second fixed current to the first dummy node when the twelfth switch is closed;

a thirteenth switch to deliver the third current and the second adjustable current to a second dummy node when the thirteenth switch is closed;

a fourteenth switch to deliver the fourth current to the second dummy node when the fourteenth switch is closed;

wherein when the first bridge is in the amplification mode, the eleventh switch is open when the first switch is closed and closed when the first switch is open, and the twelfth switch is open when the second switch is closed and closed when the second switch is open;

wherein when the second bridge is in the amplification mode, the thirteenth switch is open when the third switch is closed and closed when the third switch is open, and the fourteenth switch is open when the fourth switch is closed and closed when the fourth switch is open;

wherein when the first bridge is in the calibration mode, the first, second, eleventh, and fourteenth switches are open, and the fifth, sixth and ninth switches are closed; and wherein when the second bridge is in the calibration mode, the third, fourth, thirteenth, and fourteenth switches are open, and the seventh, eighth and eleventh switches are closed.

13. The apparatus of claim 9, wherein at least one of the current sources comprises at least one of:
a resistive degenerated current source; and
a cascode transistor.

14. The apparatus of claim 9, wherein at least one of the switches comprises at least one of:
a T-switch; and
a T-switch, wherein each gate of the T-switch is driven by independent inverter chains.

15. The apparatus of claim 9, wherein the adjustment circuit comprises at least one of:
a chopper-stabilized differential amplifier; and
first and second differential amplifiers, wherein the first differential amplifier adjusts the first adjustable current and the second differential amplifier operates in auto-zero mode when the first bridge is in calibration mode, and wherein the second differential amplifier adjusts the second adjustable current and the first differential amplifier operates in auto-zero mode when the second bridge is in calibration mode.

16. The apparatus of claim 1, further comprising:
a control block adapted to generate first and second pulse-width modulated (PWM) control signals in response to a digital input signal, wherein the first switch operates in accordance with the first PWM control signal and the second switch operates in accordance with the second PWM control signal;
an integrator adapted to integrate the current at the second output node in accordance with a feedback signal; and
a comparator adapted to generate a comparison signal having a first logic level if an output signal of the integrator is greater than a reference signal and a second logic level if the output signal of the integrator is smaller than the reference signal.

17. The apparatus of claim 16, wherein the control block further generates a third PWM signal that is delayed with respect to the first PWM signal and a fourth PWM signal that is delayed with respect to the second PWM signal, the apparatus further comprising:
a switch logic adapted to receive the third and fourth PWM signals and the comparison signal and to generate first, second and third driver control signals.

18. The apparatus of claim 17, further comprising:
a driver adapted to receive the first, second and third driver control signals, the driver further comprising
a first transistor adapted to deliver a first voltage to a second output node in response to the first driver control signal,
a second transistor adapted to deliver a second voltage to the second output node in response to the second driver control signal, and
a third transistor adapted to deliver a third voltage to the second output node in response to the third driver control signal, wherein the feedback signal is supplied by the second output node.

19. The apparatus of claim 18, wherein the first voltage is a positive supply voltage, the second voltage is a negative supply voltage, and the third voltage is the ground voltage.

20. The apparatus of claim 18, further comprising:
a low-pass filter coupled to the second output node.

21. The apparatus of claim 16, wherein the control block comprises:
an upsampler adapted to upconvert a sampling rate of the digital input signal.

22. The apparatus of claim 21, wherein the control block further comprises:
a sampling point module adapted to identify cross sections of a sawtooth or a triangular signal with the upconverted digital input signal, the cross sections defining a first binary word.

23. The apparatus of claim 22, wherein the control block further comprises:
a noise shaper adapted to receive the first binary word and generate a second binary word having fewer bits than the first binary word.

24. The apparatus of claim 23, wherein the control block further comprises:
a pulse-width modulator adapted to generate the first, second, third and fourth PWM signals in accordance with the second binary word.

25. The apparatus of claim 24, wherein the pulse-width modulator further comprises:
circuitry adapted to increase a width of each of the first, second, third and fourth PWM signals by a minimum pulse width.

26. The apparatus of claim 25, wherein the pulse-width modulator further comprises:
circuitry adapted to subtract a pulse having the minimum width from of each of the first, second, third and fourth PWM signals.

27. The apparatus of claim 26, wherein the pulse-width modulator further comprises:
circuitry adapted to increase a width of a pulse by a minimum amount if the width of the pulse is less than a predefined value.

28. The apparatus of claim 27, wherein the pulse-width modulator further comprises:
circuitry adapted to subtract a pulse having the minimum width from the pulse.

29. The apparatus of claim 16:
wherein the digital input signal is a digital audio signal.

30. The apparatus of claim 16:
wherein the digital input signal is a digital video signal.

31. The apparatus of claim 29:
wherein the digital audio signal is compliant with Inter-IC Sound (I2S) specification.

32. The apparatus of claim 18, wherein the switch logic further comprises:
first circuitry adapted to generate a pulse in response to a falling edge of the comparison signal.

33. The apparatus of claim 18, wherein the switch logic further comprises:
second circuitry adapted to generate a pulse in response to a rising edge of the comparison signal.

34. The apparatus of claim 1, further comprising:
a voltage-controlled oscillator (VCO) having an input coupled to the output node;
a loop filter having an input connected to an output of the VCO; and
a phase detector adapted to produce first and second control signals based on an input signal received as a positive input to the phase detector and an output of the loop filter received as a negative input to the phase detector; and
wherein the first switch and second switches operate in accordance with the first and second control signals, respectively.

35. A method comprising:
switching a first combined current to an output node in accordance with a first input signal, wherein the first combined current comprises a first fixed current and a first adjustable current;
switching a second fixed current to the output node in accordance with a second input signal, wherein the first combined current and the second fixed current are not switched to the output node simultaneously; and
adjusting the first adjustable current based on the first combined current and the second fixed current.

36. The method of claim 35, wherein adjusting the first adjustable current based on the first combined current and the second fixed current comprises:
switching the first combined current to a calibration node;
switching the second fixed current to the calibration node; and
adjusting the first adjustable current based on a voltage of the calibration node.

37. The method of claim 36, wherein adjusting the first adjustable current based on the voltage of the calibration node comprises:
comparing the voltage of the calibration node with a reference voltage; and
adjusting the first adjustable current based on a difference between the voltage of the calibration node and the reference voltage.

38. The method of claim 36, further comprising:
switching the first combined current to a first dummy node when not switching the first combined current to the output node or the calibration node; and
switching the second fixed current to the first dummy node when not switching the second fixed current to the output node or the calibration node.

39. The method of claim 35, further comprising:
operating a first bridge in an amplification mode while operating a second bridge in a calibration mode; and
operating the second bridge in the amplification mode while operating the first bridge in the calibration mode;
wherein operating the first bridge in the amplification mode comprises
switching the first combined current to the output node in accordance with the first input signal, and
switching the second fixed current to the output node in accordance with the second input signal;
wherein operating the first bridge in the calibration mode comprises adjusting the first adjustable current based on the first combined current and the second fixed current;
wherein operating the second bridge in the amplification mode comprises
switching a second combined current to the output node in accordance with the first input signal, wherein the second combined current comprises a third fixed current and a second adjustable current, and
switching a fourth fixed current to the output node in accordance with the second input signal, wherein the second combined current and the fourth fixed current are not switched to the output node simultaneously; and
wherein operating the second bridge in the calibration mode comprises adjusting the second adjustable current based on the second combined current and the fourth fixed current.

40. The method of claim 39:
wherein adjusting the first adjustable current based on the first combined current and the second fixed current comprises
switching the first combined current to a calibration node;
switching the second fixed current to the calibration node; and
adjusting the first adjustable current based on a voltage of the calibration node; and
wherein adjusting the second adjustable current based on the second combined current and the fourth fixed current comprises
switching the second combined current to the calibration node;
switching the fourth fixed current to the calibration node; and
adjusting the second adjustable current based on the voltage of the calibration node.

41. The method of claim 40:
wherein adjusting the first adjustable current based on the voltage of the calibration node comprises
comparing the voltage of the calibration node with a reference voltage, and
adjusting the first adjustable current based on a difference between the voltage of the calibration node and the reference voltage; and
wherein adjusting the second adjustable current based on the voltage of the calibration node comprises
comparing the voltage of the calibration node with a reference voltage, and
adjusting the second adjustable current based on a difference between the voltage of the calibration node and the reference voltage.

42. The method of claim 40, further comprising:
switching the first combined current to a first dummy node when not switching the first combined current to the output node or the calibration node;
switching the second fixed current to the first dummy node when not switching the second fixed current to the output node or the calibration node;
switching the second combined current to a second dummy node when not switching the second combined current to the output node or the calibration node; and
switching the second fixed current to the second dummy node when not switching the second fixed current to the output node or the calibration node.

43. The method of claim 35, further comprising:
generating first and second pulse-width modulated (PWM) control signals in response to a digital input signal, wherein the first combined current is switched to the first output node in accordance with the first PWM control signal and the second current is switched to the first output node in accordance with the second PWM control signal;

generating a third signal in response to the first and second PWM control signals;

integrating the third signal in accordance with a feedback signal; and generating a comparison signal having a first logic level if the integrated signal is greater than a reference signal and a second logic level if the integrated signal is smaller than the reference signal.

44. The method of claim 43, further comprising:

generating a third PWM signal that is delayed with respect to the first PWM signal;

generating a fourth PWM signal that is delayed with respect to the second PWM signal; and generating first, second and third driver control signals in response to the third and fourth PWM signals and the comparison signal.

45. The method of claim 44, further comprising:

delivering a first voltage to a second output node in response to the first driver control signal;

delivering a second voltage to the second output node in response to the second driver control signal; and delivering a third voltage to the second output node in response to the third driver control signal.

46. The method of claim 45:

wherein the first voltage is a positive supply voltage, the second voltage is a negative supply voltage and the third voltage is the ground voltage.

47. The method of claim 45, further comprising:

low-pass filtering the second output node's voltage.

48. The method of claim 43, further comprising:

upconverting a sampling rate of the digital input signal.

49. The method of claim 48, further comprising:

identifying cross sections of a sawtooth or a triangular signal with the upconverted digital input signal, the cross sections defining a first binary word.

50. The method of claim 49, further comprising:

noise shaping the first binary word to generate a second binary word having fewer bits than the first binary word.

51. The method of claim 50, further comprising:

generating the first, second, third and fourth PWM signals in accordance with the second binary word.

52. The method of claim 51, further comprising:

increasing a width of one or more of the first, second, third and fourth PWM signal by a minimum pulse width if the width of the one or more of the first, second, third and fourth PWM signals is detected as being smaller than a predefined value.

53. The method of claim 52, further comprising:

subtracting a minimum pulse width from the one or more of the first, second, third and fourth PWM signals having increased widths.

54. The method of claim 51, further comprising:

increasing a width of the first, second, third and fourth PWM signals by a minimum pulse width.

55. The method of claim 54, further comprising:

subtracting a minimum pulse width from the first, second, third and fourth PWM signals having increased widths.

56. The method of claim 43:

wherein the digital input signal is a digital audio signal.

57. The method of claim 43:

wherein the digital input signal is a digital video signal.

58. The method of claim 56:

wherein the digital audio signal is compliant with Inter-IC Sound (I2S) specification.

59. The method of claim 44, further comprising:

generating a pulse in response to a falling edge of the comparison signal.

60. The method of claim 44, further comprising:

generating a pulse in response to a rising edge of the comparison signal.

* * * * *

UNITED STATES PATENT AND TRADEMARK OFFICE
CERTIFICATE OF CORRECTION

PATENT NO. : 7,551,028 B1  Page 1 of 1
APPLICATION NO. : 12/001357
DATED : June 23, 2009
INVENTOR(S) : Sasan Cyrusian It is certified that error appears in the above-identified patent and that said Letters Patent is hereby corrected as shown below:

| | |
|---|---|
| Column 1, Line 67 | Delete "form" and insert -- from -- |
| Column 2, Line 59 | Delete "is" after "switches" |
| Column 4, Line 39 | Delete "the integrator" after "of" |
| Column 4, Line 41 | Delete "the integrator" after "of" |
| Column 5, Line 13 | Delete "of" after "from" |
| Column 8, Line 20 | Delete "for" after "means" |
| Column 8, Line 22 | Delete "for" after "means" |
| Column 10, Line 22 | Delete "of" after "from" |
| Column 13, Line 12 | Delete "to" after "applied" |
| Column 13, Line 42 | Insert -- be -- after "to" (second occurrence) |
| Column 14, Line 6 | Delete "$I^2S$" and insert -- I2S -- |
| Column 14, Line 16 | Delete "D1" and insert -- $D_1$ -- |
| Column 16, Line 60 | Delete "raise" and insert -- raised -- |

Signed and Sealed this

Thirteenth Day of October, 2009

David J. Kappos
*Director of the United States Patent and Trademark Office*